(12) United States Patent
Wang et al.

(10) Patent No.: US 12,557,386 B2
(45) Date of Patent: Feb. 17, 2026

(54) LIGHT-EMITTING SUBSTRATE AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Jie Wang, Beijing (CN); Zouming Xu, Beijing (CN); Jian Tian, Beijing (CN); Chunjian Liu, Beijing (CN); Xintao Wu, Beijing (CN); Jie Lei, Beijing (CN); Qin Zeng, Beijing (CN); Jianying Zhang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 345 days.

(21) Appl. No.: 18/033,048

(22) PCT Filed: Nov. 20, 2020

(86) PCT No.: PCT/CN2020/130660
§ 371 (c)(1),
(2) Date: Apr. 20, 2023

(87) PCT Pub. No.: WO2022/104752
PCT Pub. Date: May 27, 2022

(65) Prior Publication Data
US 2023/0387140 A1    Nov. 30, 2023

(51) Int. Cl.
*H01L 27/12* (2006.01)
*H01L 25/16* (2023.01)
(Continued)

(52) U.S. Cl.
CPC ........... *H10D 86/60* (2025.01); *H01L 25/167* (2013.01); *H10D 86/441* (2025.01)

(58) Field of Classification Search
CPC .... H10D 86/60; H10D 86/441; H01L 25/167; H01L 25/0753; H10H 20/857; G09G 3/32
See application file for complete search history.

(56) References Cited

U.S. PATENT DOCUMENTS

2005/0140642 A1   6/2005   Chiu et al.
2006/0220991 A1   10/2006  Lee et al.
(Continued)

FOREIGN PATENT DOCUMENTS

CN   1722443 A   1/2006
CN   1841142 A   10/2006
(Continued)

OTHER PUBLICATIONS

PCT/CN2020/130660 international search report.

*Primary Examiner* — Jarrett J Stark
(74) *Attorney, Agent, or Firm* — IPro, PLLC

(57) ABSTRACT

Provided are a light-emitting substrate and a display device. The light-emitting substrate comprises: a substrate base, comprising multiple light-emitting units arranged in an array, wherein each light-emitting unit comprises a drive circuit and a light-emitting group coupled with the drive circuit, the light-emitting group comprising multiple light-emitting elements; and first signal wires located on the substrate base and extending in a first direction, wherein the drive circuits in at least two different light-emitting units in the first direction are coupled with each other, each drive circuit comprises a first input end, and each first signal wire is coupled with the first input end of one drive circuit of at least two drive circuits that are coupled with each other.

20 Claims, 11 Drawing Sheets

(51) Int. Cl.
*H10D 86/40* (2025.01)
*H10D 86/60* (2025.01)

(56) References Cited

U.S. PATENT DOCUMENTS

| | | | |
|---|---|---|---|
| 2011/0241563 A1 | 10/2011 | Kim et al. | |
| 2016/0377904 A1 | 12/2016 | Shin et al. | |
| 2024/0412683 A1* | 12/2024 | Chen | ........................ G09G 3/32 |

FOREIGN PATENT DOCUMENTS

| | | | |
|---|---|---|---|
| CN | 106298734 | A | 1/2017 |
| CN | 109801568 | A | 5/2019 |
| CN | 110164326 | A | 8/2019 |
| CN | 110265454 | A | 9/2019 |
| JP | 2000089691 | A | 3/2000 |

* cited by examiner

LIGHT-EMITTING SUBSTRATE AND DISPLAY DEVICE

CROSS REFERENCE TO RELATED APPLICATIONS

This application is a national phase entry under 35 U.S.C. § 371 of International Application No. PCT/CN2020/130660, filed on Nov. 20, 2020, the entire content of which is incorporated herein by reference.

FIELD

The disclosure relates to the field of light emitting technology, in particular to a light-emitting substrate and a display apparatus.

BACKGROUND

With the development of a light emitting diode technology, a backlight source adopting light emitting diodes of sub-millimeter or even micrometer has been widely used. As a result, not only can a contrast of an image of a transmissive display product utilizing the backlight source reach a level of an organic light emitting diode (OLED) display product, but the product can also retain the technical advantages of liquid crystal display (LCD), thereby improving a display effect of the image and providing users with better visual experience.

SUMMARY

A light-emitting substrate according to some embodiments of the disclosure, includes: a base substrate, including a plurality of light-emitting units arranged in an array, where each light-emitting unit includes a drive circuit and a light-emitting group coupled with the drive circuit, and the light-emitting group includes a plurality of light-emitting elements; and a first signal line, located on the base substrate and extending in a first direction. The drive circuits in at least two different light-emitting units in the first direction are coupled with each other, each drive circuit includes a first input terminal, and the first signal line is coupled with the first input terminal of a drive circuit in at least two drive circuits that are coupled with each other.

In some embodiments, the drive circuits in the at least two different light-emitting units are coupled with each other through at least one first connecting line.

In some embodiments, each drive circuit further includes an output terminal; and in the at least two drive circuits that are coupled with each other, the output terminal of the drive circuit coupled with the first signal line is coupled with the first input terminal of one of other drive circuits through the first connecting line.

In some embodiments, the plurality of light-emitting units are arranged in N rows and M columns and divided into a plurality of light-emitting unit groups, each light-emitting unit group includes N rows and Y columns, with a total of N*Y light-emitting units, and a first signal line corresponds to a light-emitting unit. In the same light-emitting unit group, the N*Y light-emitting units are sequentially numbered according to row and column distribution positions, the first input terminal of the drive circuit of the light-emitting unit with index of 1 is electrically connected with the first signal line corresponding to the light-emitting unit group, and the output terminal of the drive circuit of the light-emitting unit with index of P is electrically connected with the first input terminal of the drive circuit of the light-emitting unit with index of (P+1) through the first connecting line; and N is an integer greater than 0, M is an integer greater than 0, 0<Y≤M and Y is an integer, 0<P<N*Y and P is an integer.

In some embodiments, in the same light-emitting unit group, the light-emitting unit with index of 1 is arranged adjacent to the light-emitting unit with index of N*Y in a second direction, and the output terminal of the drive circuit of the light-emitting unit with index of N*Y/2 is arranged adjacent to the drive circuit of the light-emitting unit with index of (N*Y/2+1) in the second direction.

In some embodiments, the light-emitting substrate further includes an output line, wherein the output line extends in the first direction; and the output terminal of the drive circuit of the light-emitting unit with index of (N*Y) is electrically connected with the output line.

In some embodiments, at least one of the first connecting line or the output line is located on one side of the first signal line facing away from the base substrate; or at least one of the first connecting line or the output line is disposed in the same layer as the first signal line.

In some embodiments, each drive circuit further includes a second input terminal; the light-emitting substrate further includes a second signal line; and the second signal line is electrically connected with the second input terminal of the drive circuit.

In some embodiments, the second signal line extends in the first direction.

In some embodiments, the second input terminals of all drive circuits in a light-emitting unit group are all electrically connected with the same second signal line.

In some embodiments, a light-emitting unit group includes two columns of light-emitting units; and in the same light-emitting unit group, the first connecting line used for coupling the drive circuits is arranged to surround the second signal line.

In some embodiments, each drive circuit further includes a common voltage terminal; each light-emitting group is electrically connected between a drive voltage terminal and the output terminal of the drive circuit; and the light-emitting substrate further includes: a common voltage signal line electrically connected with the common voltage terminal, and a drive signal line electrically connected with the drive voltage terminal, wherein the common voltage signal line and the drive signal line both extend in the first direction.

In some embodiments, a column of light-emitting units corresponds to a common voltage signal line and a drive signal line.

In some embodiments, as for the common voltage signal line, the drive signal line and the second signal line corresponding to a column of light-emitting units, the common voltage signal line is located between the drive signal line and the second signal line.

In some embodiments, a light-emitting unit group includes two columns of light-emitting units; and orthographic projections of the two drive signal lines corresponding to the same light-emitting unit group on the base substrate are symmetric in respect to an orthographic projection of the second signal line on the base substrate.

In some embodiments, a light-emitting unit group includes two columns of light-emitting units; and orthographic projections of the two common voltage signal lines corresponding to the same light-emitting unit group on the base substrate are symmetric in respect to an orthographic projection of the second signal line on the base substrate.

A display apparatus according to some embodiments of the disclosure includes the above light-emitting substrate.

DETAILED DESCRIPTION

Figure 1:
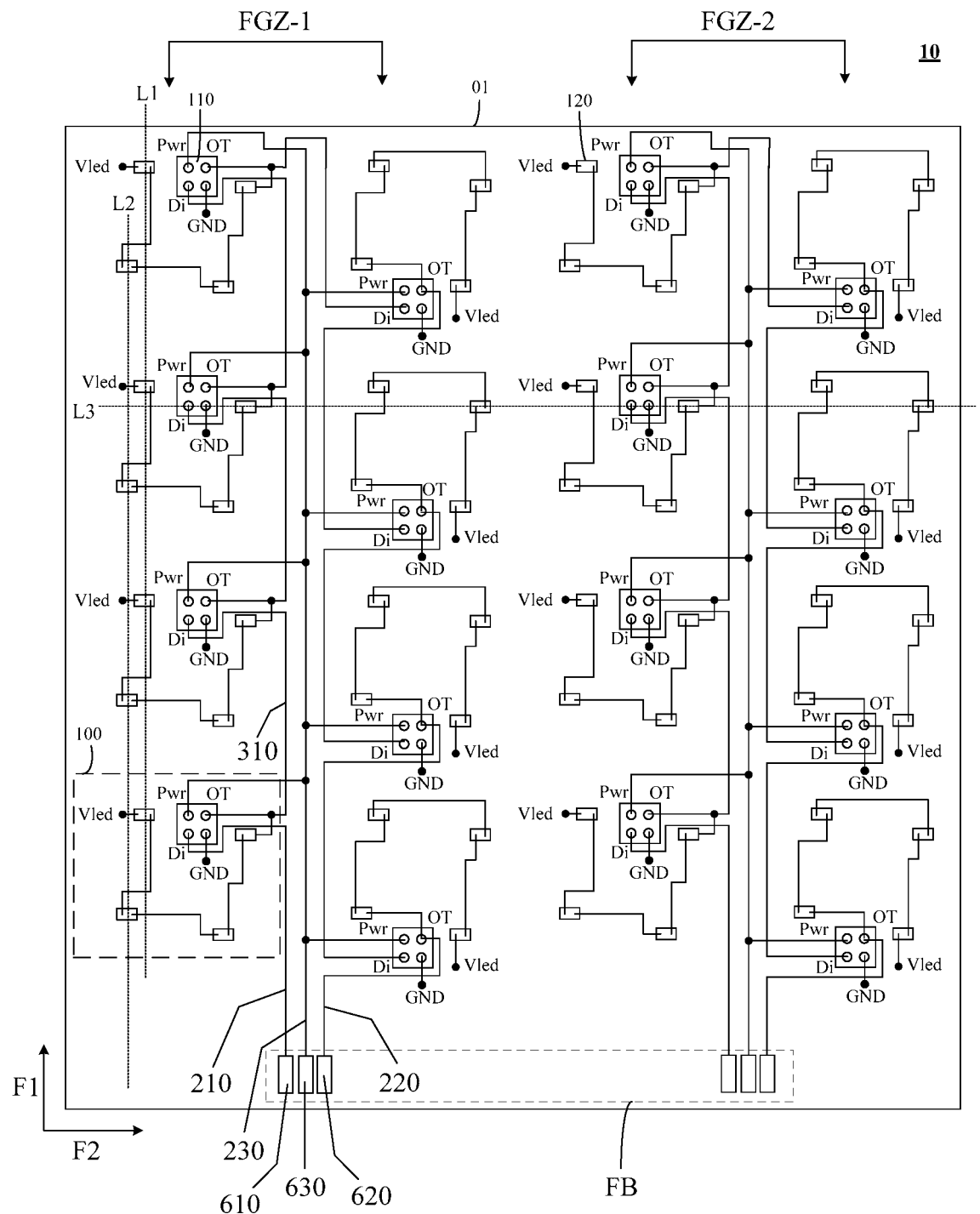
FIG. 1 is a schematic diagram of a light-emitting substrate according to some embodiments of the disclosure.

To make objectives, technical solutions and advantages of embodiments of the disclosure clearer, the technical solutions of the embodiments of the disclosure will be clearly and completely described below in conjunction with accompanying drawings of the embodiments of the disclosure. Apparently, the described embodiments are only a part of the embodiments of the disclosure, not all of the embodiments. The embodiments in the disclosure and features in the embodiments can be combined with each other in the case of not conflicting. Based on the described embodiments of the disclosure, all other embodiments obtained by those ordinarily skilled in the art without creative work shall fall within the protection scope of the disclosure.

Unless otherwise indicated, technical or scientific terms used in the disclosure shall have the ordinary meanings understood by those ordinarily skilled in the art to which the disclosure pertains. The words "first", "second" and the similar words used in the disclosure do not indicate any order, quantity or importance, but are merely used to distinguish different components. The words "comprise" or "include", and the like indicate that an element or item appearing before such the word covers listed elements or items appearing after the word and equivalents thereof, and does not exclude other elements or items. The words "connect" or "link" or the like are not limited to physical or mechanical connection, but may include electrical connection, whether direct or indirect.

It needs to be noted that the sizes and shapes of all figures in the accompanying drawings do not reflect true scales, and are only intended to schematically illustrate the content of the disclosure. The same or similar reference numerals represent the same or similar elements or elements with the same or similar functions all the time.

A mini light emitting diode (Mini-LED) or a micro light emitting diode (Micro-LED) has a small size and high brightness, and may be widely applied to display apparatuses or backlight modules thereof. By finely adjusting backlight, display of images with high-dynamic ranges (HDRs) is realized. For example, a typical size (such as a length) of the Micro-LED is smaller than 100 microns, such as 10 microns to 80 microns; and a typical size (such as a length) of the Mini-LED is 80 microns to 350 microns, such as 80 microns to 120 microns. Since s light emitting diode is a current driven element, a current signal needs to be transmitted by a signal line to the light emitting diode from a drive chip. For example, each light emitting diode in a backlight module is controlled independently, a plurality of signal lines are needed to be connected with the corresponding light emitting diodes to provide signals. However, due to limitations of a trace space, signal interference may occur among the signal lines.

At least one embodiment of the disclosure provides a light-emitting substrate and a display apparatus. The light-emitting substrate may realize regional independent control of light-emitting brightness, with low power consumption, high integration and simple control method. It can be used in conjunction with passive display devices such as a liquid crystal display panel, to realize high-contrast display. Moreover, the light-emitting substrate may reduce signal interference and improve a display effect.

The embodiments of the disclosure will be described in detail below with reference to the accompanying drawings. It should be noted that the same reference numerals in different accompanying drawings will be used to refer to the same elements that have already been described.

As shown in FIG. 1, at least one embodiment of the disclosure provides a light-emitting substrate, including a base substrate 01, and the base substrate 01 includes a plurality of light-emitting units 100 arranged in an array. Each light-emitting unit 100 may include a drive circuit 110 and a light-emitting group coupled with the drive circuit 110, and the light-emitting group includes a plurality of light-emitting elements 120. Exemplarily, each drive circuit 110 may include a first input terminal Di, a second input terminal Pwr and an output terminal OT. The plurality of light-emitting elements 120 are sequentially connected in series and are connected between a drive voltage terminal Vled and the output terminal OT.

Figure 2:
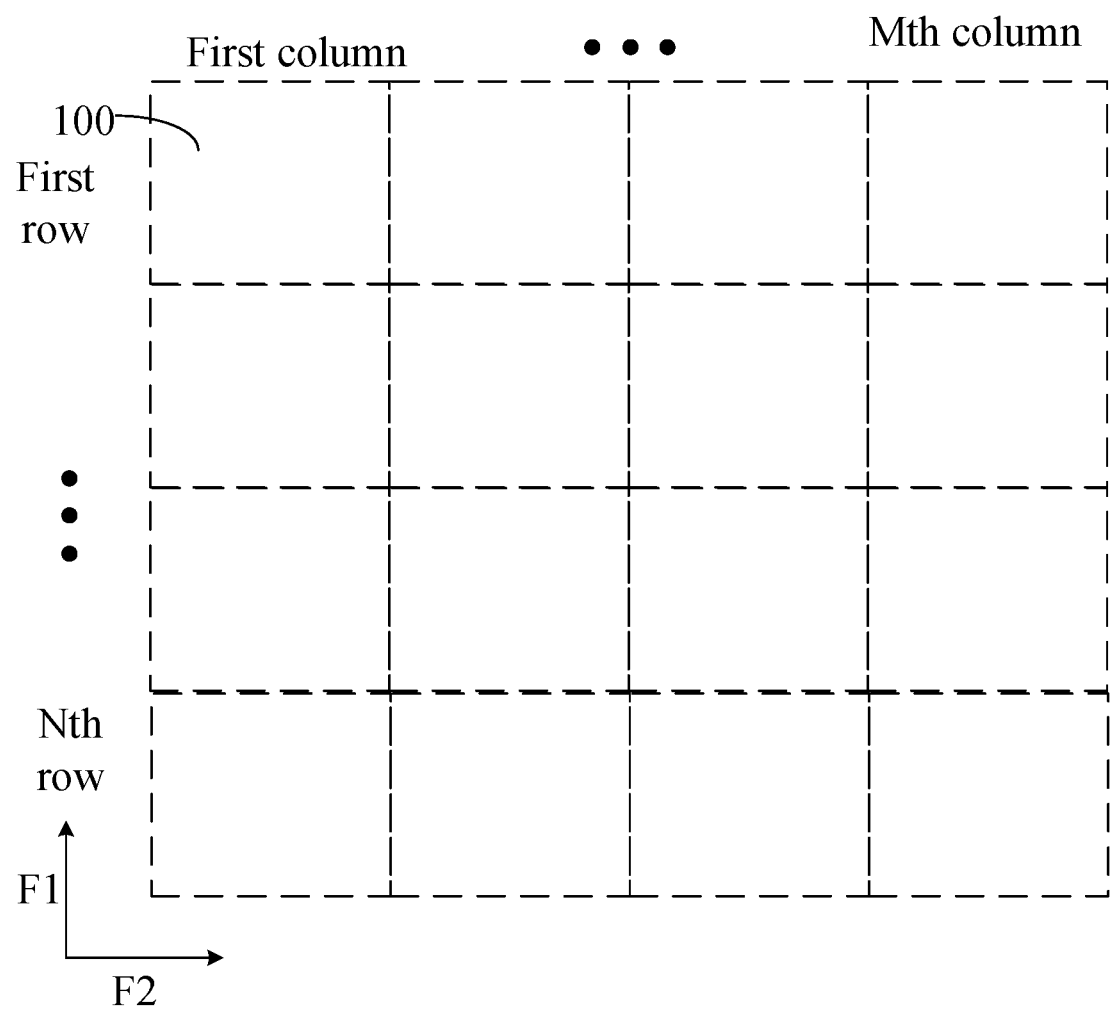
FIG. 2 is a schematic diagram of arrangement of light-emitting units of the light-emitting substrate shown in FIG. 1.

As shown in FIG. 1 and FIG. 2, the light-emitting substrate 10 includes the base substrate 01 and the plurality of light-emitting units 100 arranged in an array on the base substrate 01. For example, the plurality of light-emitting units 100 are arranged into N rows and M columns, N is an integer greater than 0 and M is an integer greater than 0. For example, the quantity of the light-emitting units 100 may be determined according to actual needs, such as according to a size of the light-emitting substrate 10 and required brightness. Although only 4 rows and 4 columns of light-emitting units 100 are shown in FIG. 1, it should be understood that the quantity of the light-emitting units 100 is not limited to this.

Exemplarily, as shown in FIG. 1 and FIG. 2, each column of light-emitting units 100 is arranged in a first direction F1, and each row of light-emitting units 100 is arranged in a second direction F2. For example, the light-emitting substrate is in a rectangular shape, the first direction F1 is a direction parallel to a long side of the light-emitting substrate 10, and the second direction F2 is a direction parallel to a short side of the light-emitting substrate 10. Of course, the first direction F1 may also be the direction parallel to the short side of the light-emitting substrate 10, and the second direction F2 may also be the direction parallel to the long side of the light-emitting substrate 10. Of course, the embodiment of the disclosure is not limited to this, the first direction F1 and the second direction F2 may be any directions, as long as the first direction F1 and the second direction F2 intersect with each other. Moreover, the plurality of light-emitting units 100 are also not limited to be arranged along a straight line, may also be arranged along a meander line, in a circular shape or in any way, which may be determined according to the actual needs, and is not limited in the embodiment of the disclosure.

Exemplarily, a material of the base substrate 01 may be selected from plastics, polyimide, silicon, ceramics, glass, quartz and the like, which is not limited in the embodiment of the disclosure.

In some embodiments, during specific implementation, as shown in FIG. 1, each light-emitting unit 100 may include a drive circuit 110, a plurality of light-emitting elements 120 and a drive voltage terminal Vled. Each drive circuit 110 includes a first input terminal Di, a second input terminal Pwr, an output terminal OT and a common voltage terminal GND. Each light-emitting group is electrically connected between the drive voltage terminal Vled and the output terminal OT of the drive circuit 110. For example, the light-emitting elements 120 in the light-emitting group are sequentially connected in series, and are electrically connected between the drive voltage terminal Vled and the output terminal OT of the drive circuit 110. Of course, the light-emitting elements 120 in each light-emitting group may also be connected in parallel, and electrically connected between the drive voltage terminal Vled and the output terminal OT of the drive circuit 110. Alternatively, some of the light-emitting elements 120 in each light-emitting group may also be connected in parallel first and then are connected in series, and electrically connected between the drive voltage terminal Vled and the output terminal OT of the drive circuit 110. In practical applications, it can be designed and determined according to the actual needs, which is not limited here.

In some embodiments, during specific implementation, each drive circuit 110 may be configured to output a relay signal through the output terminal OT within a first time period according to a first input signal received by the first input terminal Di and a second input signal received by the second input terminal Pwr, and provide a drive signal to the plurality of light-emitting elements 120 which are sequentially connected in series through the output terminal OT within a second time period. Exemplarily, the first input terminal Di receives the first input signal, and the first input signal, such as an address signal, is used for gating the drive circuit 110 with a corresponding address. For example, the addresses of different drive circuits 110 may be the same or different. The first input signal may be an 8-bit address signal, and a to-be-transmitted address may be obtained by parsing the address signal. The second input terminal Pwr receives the second input signal, and the second input signal is, such as a power line carrier communication signal. For example, the second input signal not only provides electrical energy to the drive circuits 110, but also transmits communication data to the drive circuits 110, the communication data may be used for controlling a light-emitting duration of the corresponding light-emitting units 100, and then controlling its visual light-emitting brightness. The output terminal OT may output different signals respectively within different time periods, for example, it outputs the relay signal and the drive signal respectively. For example, the relay signal is an address signal provided to other drive circuits 110, that is, the first input terminal Di of the other drive circuit 110 receives the relay signal as the first input signal, so as to obtain the address signal. For example, the drive signal may be a drive current, used for driving the light-emitting elements 120 to emit light. The common voltage terminal GND receives a common voltage signal, such as a grounding signal.

Each drive circuit 110 is configured to output the relay signal through the output terminal OT within the first time period according to the first input terminal received by the first input terminal Di and the second input signal received by the second input terminal Pwr, and provide the drive signal to the plurality of light-emitting elements 120 which are sequentially connected in series through the output terminal OT within the second time period. Within the first time period, the output terminal OT outputs the relay signal, and the relay signal is provided to other drive circuits 110, so as to enable other drive circuits 110 to obtain the address signal. Within the second time period, the output terminal OT outputs the drive signal, and the drive signal is provided to the plurality of light-emitting elements 120 which are sequentially connected in series, so as to enable the light-emitting elements 120 to emit light within the second time period. For example, the first time period and the second time period are different time periods, and the first time period may be, for example, earlier than the second time period. The first time period may be successively connected to the second time period, an end moment of the first time period is a start moment of the second time period; or there may be other time periods between the first time period and the second time period, the other time periods may be used for realizing other required functions, and the other time periods may also be a gap period between the first time period and the second time period, so as to avoid interference between signals of the output terminal OT in the first time period and the second time period.

It should be noted that when the drive signal is the drive current, the drive current may flow from the output terminal OT to the light-emitting elements 120, and may also flow from the light-emitting elements 120 into the output terminal OT, and a flowing direction of the drive current may be determined according to the actual needs, which is not limited in the embodiment of the disclosure. In this article, "the output terminal OT outputs the drive signal" represents that the output terminal OT provides the drive signal, and the direction of the drive signal may either flow out of the output terminal OT or flow into the output terminal OT.

Exemplarily, shown in FIG. 1, the plurality of light-emitting elements 120 are sequentially connected in series and are connected in series between the drive voltage terminal Vled and the output terminal OT. For example, each light-emitting element 120 may be a micro light emitting diode (Micro-LED) or a mini light emitting diode (Mini-LED). For example, each light-emitting element 120 includes a positive side (+) and a negative side (−) (or may also be called an anode and a cathode), and the plurality of light-emitting elements 120 are sequentially connected in anode-to-cathode series, so as to form a current flow path between the drive voltage terminal Vled and the output terminal OT. Moreover, the drive voltage terminal Vled may provide a drive voltage, for example, it is a high voltage within a time period (the second time period) when the light-emitting elements 120 need to emit light, and it is a low voltage in other time periods. Therefore, within the second time period, the drive signal (such as the drive current) flows from the drive voltage terminal Vled through the plurality of light-emitting elements 120 sequentially, and then flows into the output terminal OT of the drive circuit 110. The plurality of light-emitting elements 120 emit light when the drive current flows, by controlling a duration of the drive current, the light-emitting duration of the light-emitting elements 120 may be controlled, and thus the visual light-emitting brightness is controlled.

Exemplarily, as shown in FIG. 1, in some embodiments, a light-emitting unit 100 may include 4 light-emitting elements 120, and the 4 light-emitting elements 120 are arranged into 2 rows and 4 columns. For example, when the 4 light-emitting elements 120 are connected in series, the light-emitting element 120 electrically connected with the drive voltage terminal Vled is taken as a start point of the series connection of the 4 light-emitting elements 120, and the light-emitting element 120 electrically connected with the output terminal OT of the drive circuit 110 is taken as an end point of the series connection of the 4 light-emitting elements 120. For example, the drive voltage terminal Vled is electrically connected with the positive electrode of each light-emitting element 120, and the output terminal OT of each drive circuit 110 is electrically connected with the cathode of each light-emitting element 120. By adopting this distribution mode and series connection mode, overlapping wiring may be effectively avoided, which facilitates design and preparation. In addition, a length of a signal connecting line between any two adjacent light-emitting elements 120 on a series connection line may be set to be approximately the same, so that resistance of the signal connecting line itself is relatively balanced, load balance may be improved, and a stability of a circuit is improved.

It should be noted that in the embodiment of the disclosure, the quantity of the light-emitting elements 120 in each light-emitting unit 100 is not limited, and may be 5, 6, 7, 8 and any other number, but not limited to 4. The plurality of light-emitting elements 120 may be arranged in any way, such as in a required pattern, rather than being limited to a matrix arrangement mode. The setting position of the drive circuits 110 is not limited and may be set in any gap between the light-emitting elements 120, which may be determined according to the actual needs and is not limited in the embodiment of the disclosure.

Figure 7:
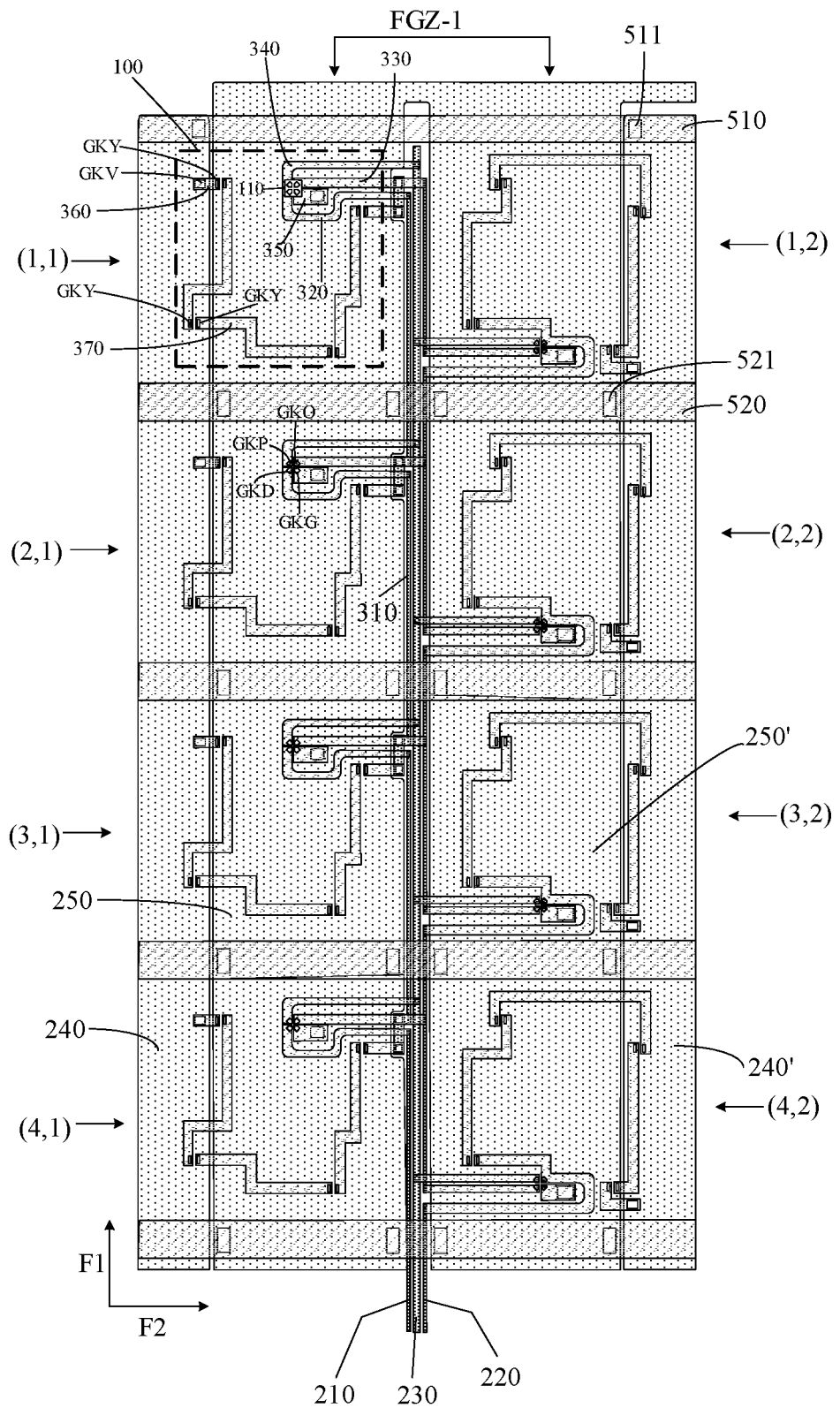
FIG. 7 is a schematic structural diagram of layout of a light-emitting substrate according to some embodiments of the disclosure.

In some embodiments, during specific implementation, with reference to FIG. 1 and FIG. 7, the light-emitting elements 120 in the same light-emitting unit 100 are connected sequentially, so as to form a polygon. For example, when a light-emitting unit includes 4 light-emitting elements 120, the 4 light-emitting elements 120 may be sequentially connected into a quadrilateral. Two sides of the quadrilateral may be parallel to a row direction, and the other two sides may be parallel to a column direction. Alternatively, two sides of the quadrilateral may have an included angle with the row direction, and the other two sides may also have an included angle with the column direction.

In some embodiments, during specific implementation, with reference to FIG. 1 and FIG. 7, in the same light-emitting unit group, in the light-emitting units 100 adjacent in the row direction, relative position relations of the light-emitting elements 120 in each light-emitting unit 100 are the same, and the light-emitting elements 120 are periodically and repeatedly arranged in the column direction F1. Further, in different light-emitting units, in the light-emitting units 100 adjacent in the column direction, relative position relations of the light-emitting elements 120 in each light-emitting unit 100 are also the same. Exemplarily, in the same light-emitting unit group, in the plurality of light-emitting units 100 which are sequentially arranged in the column direction, the light-emitting elements 120 located at the same position in each light-emitting unit 100 may be arranged in the column direction F1. For example, in the plurality of light-emitting units 100 arranged in the column direction, the light-emitting elements 120 located at the same position in each light-emitting unit 100 may be approximately arranged in the same straight line in the column direction. Exemplarily, with reference to FIG. 1, a straight line L1 extends in the column direction, the light-emitting elements 120 distributed in the straight line L1 located at the same position in the light-emitting units 100 arranged in the column direction, that is, the light-emitting elements 120 at the same position in the light-emitting units 100 arranged in the column direction may be approximately arranged in a straight line L1 in the column direction. A straight line L2 extends in the column direction, the light-emitting elements 120 distributed in the straight line L2 are located at other positions in the light-emitting units 100 arranged in the column direction, that is, the light-emitting elements 120 at other positions in the light-emitting units 100 arranged in the column direction may be approximately laid in a straight line L2 in the column direction.

In some embodiments, with reference to FIG. 1, in the light-emitting units 100 adjacent in the row direction, the light-emitting elements 120 located at the same position in each light-emitting unit 100 may be approximately distributed in the same straight line in the row direction F2. For example, a straight line L3 extends in the row direction, the light-emitting elements 120 distributed in the straight line L3 are located at the same position in the light-emitting units 100 arranged in the row direction, that is, the light-emitting elements 120 at the same position in the light-emitting units 100 arranged in the column direction may be approximately distributed in a straight line L3 in the row direction F2.

In some embodiments, during specific implementation, with reference to FIG. 1 and FIG. 7, in the same light-emitting unit group, in the light-emitting units 100 adjacent in the row direction, relative positions of the drive circuits in the light-emitting units may be different, and in the light-emitting units 100 adjacent in the column direction, the positions of the drive circuits in the light-emitting units may be the same. In addition, the drive circuits in two adjacent columns of light-emitting units in the same light-emitting unit group may be arranged in a staggered mode.

For ease of description, the light-emitting units in the light-emitting substrate arranged in rows and columns are labeled based on coordinates. For example, coordinates labeled corresponding to the light-emitting units in a $b^{th}$ column and an $a^{th}$ row may be (b, a), $1 \le a \le M$ and $1 \le b \le N$. For example, in a light-emitting unit group, for a first light-emitting unit group FGZ-1:

a drive circuit in a light-emitting unit (1, 1), a drive circuit in a light-emitting unit (1, 2) and a drive circuit in a light-emitting unit (2, 1) are respectively located at three vertices of a triangle, such as three vertices of a first equilateral triangle; the drive circuit in the light-emitting unit (2, 1), the drive circuit in the light-emitting unit (1, 2) and a drive circuit in the light-emitting unit (2, 2) may be respectively located at three vertices of a triangle, such as three vertices of a second equilateral triangle; the drive circuit in the light-emitting unit (2, 1), the drive circuit in the light-emitting unit (2, 2) and a drive circuit in a light-emitting unit (3, 1) may be respectively located at three vertices of a triangle, such as three vertices of a third equilateral triangle; and the drive circuit in the light-emitting unit (3, 1), the drive circuit in the light-emitting unit (2, 2) and a drive circuit in a light-emitting unit (3, 2) may be respectively located at three vertices of a triangle, such as three vertices of a fourth equilateral triangle.

A line connecting a center of the first equilateral triangle and a center of the third equilateral triangle is parallel to the column direction F1; and a line connecting a center of the second equilateral triangle and a center of the fourth equilateral triangle is also parallel to the column direction F1.

A layout rule of the drive circuits in other light-emitting units belonging to the same light-emitting unit group is as described above, and so on, which will not be repeated here.

For two adjacent light-emitting unit groups, namely a first light-emitting unit group FGZ-1 and a second light-emitting unit group FGZ-2:

a drive circuit in a light-emitting unit (1, 2) belonging to the first light-emitting unit group FGZ-1, and a drive circuit in a light-emitting unit (1, 3) and a drive circuit in a light-emitting unit (2, 3) which belong to the second light-emitting unit group FGZ-2 may be respectively located at three vertices of a triangle, such as three vertices of a fifth equilateral triangle; the drive circuit in the light-emitting unit (2, 3) which belongs to the second light-emitting unit group FGZ-2, and the drive circuit in the light-emitting unit (1, 2) and a drive circuit in the light-emitting unit (2, 2) which belong to the first light-emitting unit group FGZ-1 may be respectively located at three vertices of a triangle, such as three vertices of a sixth equilateral triangle; and the drive circuit in the light-emitting unit (1, 3), a drive circuit in a light-emitting unit (1, 4) and the drive circuit in the light-emitting unit (2, 3) which belong to the second light-emitting unit group FGZ-2 may be respectively located at three vertices of a triangle, such as three vertices of a seventh equilateral triangle.

A line connecting the center of the first equilateral triangle, a center of the fifth equilateral triangle and a center of the seventh equilateral triangle is parallel to the row direction F2; and a line connecting the center of the second equilateral triangle and a center of the sixth equilateral triangle is parallel to the row direction F2.

The arrangement mode of the drive circuits in the plurality of light-emitting units on the light-emitting substrate may be set according to the above rule, which will not be repeated here. In some embodiments, during specific implementation, with reference to FIG. 1 and FIG. 7, in the row direction, the arrangement of the light-emitting elements and the drive circuits in a light-emitting unit group is repeated and the light-emitting unit group is taken as a repeating unit, the light-emitting substrate 10 may include a plurality of repeating units, and the adjacent repeating units are arranged at intervals and distributed periodically in the row direction. In this way, a light-emitting unit group may be taken as a repeating unit for repeatedly arrangement, so as to form the light-emitting substrate 10. In this way, in the light-emitting units 100 arranged in the row direction, relative positions of the plurality of light-emitting elements 120 and the drive circuits 110 in each light-emitting unit 100 may be basically the same. In some embodiments, during specific implementation, each drive circuit 110 may include a demodulator circuit, a physical layer interface circuit, a data processing control circuit, a pulse width modulation circuit, a drive signal generation circuit, a relay signal generation circuit and a power supply circuit.

Exemplarily, the demodulator circuit is electrically connected with the second input terminal Pwr and the physical layer interface circuit, and is configured to demodulate the second input signal to obtain communication data, and transmit the communication data to the physical layer interface circuit. For example, the second input signal input by the second input terminal Pwr is a power line carrier communication signal, and the power line carrier communication signal contains information corresponding to the communication data. For example, the communication data is data reflecting the light-emitting duration, and then represents the required light-emitting brightness. Compared to a usual serial peripheral interface (SPI) protocol, in the embodiment of the disclosure, a power line carrier communication (PLC) protocol is adopted to overlay the communication data on a power signal, so that the quantity of signal lines is effectively reduced.

Figure 3:
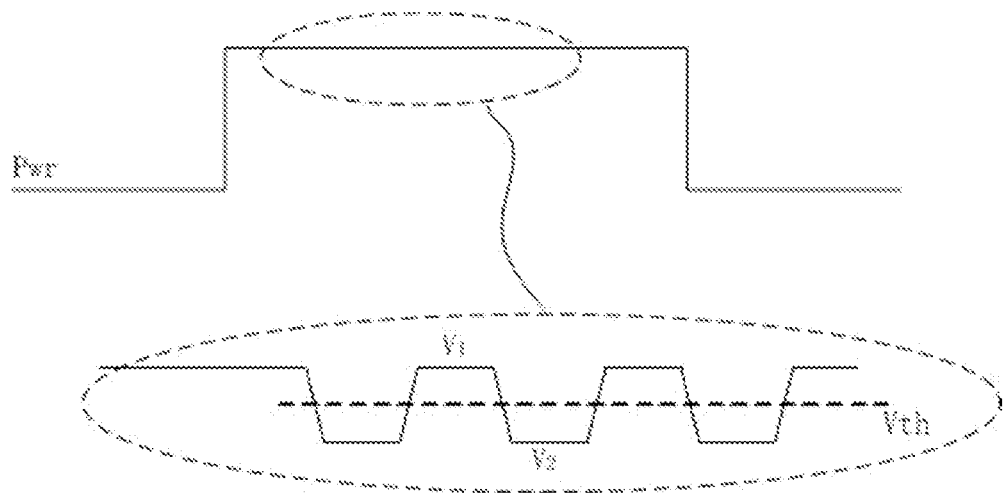
FIG. 3 is a waveform diagram of a second input signal for a drive circuit according to some embodiments of the disclosure.

FIG. 3 is a waveform diagram of a second input signal of a drive circuit 110. As shown in FIG. 3, a dashed elliptical frame represents an enlarged view of a corresponding waveform, when the second input signal is a high level, its high-level amplitude fluctuates near a threshold amplitude Vth, for example, it changes between a first amplitude V1 and a second amplitude V2, and V2<Vth<V1. By modulating a change rule of the first amplitude V1 and the second amplitude V2, the communication data may be modulated into the second input signal, so that the second input signal transmits information corresponding to the communication data while transmitting electrical energy. For example, the demodulator circuit filters out a direct current power component of the second input signal, so as to obtain the communication data. For the detailed description of the second input signal, please refer to a conventional power line carrier communication signal, which will not be detailed here. Accordingly, the detailed description of the demodulator circuit may also refer to a demodulator circuit of the conventional power line carrier communication signal, which will not be detailed here.

Exemplarily, the physical layer interface circuit is further electrically connected with the data processing control circuit, and is configured to process the communication data to obtain a data frame (such as frame-frequency data), and transmit the data frame to the data processing control circuit. The data frame obtained by the physical layer interface circuit contains information that needs to be transmitted to the drive circuit 110, such as information related to light-emitting time (such as a specific duration of the light-emitting time). For example, the physical layer interface circuit may be a usual port physical (PHY) layer, and the detailed description may refer to a conventional design, which will not be detailed here.

Exemplarily, the data processing control circuit is further electrically connected with the first input terminal Di, the pulse width modulation circuit and the relay signal generation circuit. The data processing control circuit is configured to generate a pulse width control signal based on the data frame and transmit the pulse width control signal to the pulse width modulation circuit, and generate a relay control signal based on the first input signal and transmit the relay control signal to the relay signal generation circuit. For example, the light-emitting duration required by the light-emitting element 120 connected with the drive circuit 110 may be obtained according to the data frame, and therefore, the corresponding pulse width control signal is generated based on the light-emitting duration. For example, the relay control signal is a signal generated after the data processing control circuit processes the first input signal. By processing the first input signal (such as parsing, latching and decoding), an address signal corresponding to the drive circuit 110 may be obtained, a relay control signal corresponding to a subsequent address may be generated, and the subsequent address corresponds to other drive circuits 110. For example, the data processing control circuit may be implemented as a microcontroller, a central processing unit (CPU), a digital signal processor and the like.

Exemplarily, the pulse width modulation circuit is further electrically connected with the drive signal generation circuit, and is configured to generate a pulse width modulation signal in response to a pulse width control signal, and transmit the pulse width modulation signal to the drive signal generation circuit. For example, the pulse width modulation signal generated by the pulse width modulation circuit corresponds to the light-emitting duration required by the light-emitting element 120, for example, an effective pulse width duration is equal to the light-emitting duration required by the light-emitting element 120. For example, the detailed description of the pulse width modulation circuit may refer to a conventional pulse width modulation circuit, which will not be detailed here.

Exemplarily, the drive signal generation circuit is further electrically connected with the output terminal OT, and is configured to generate a drive signal in response to the pulse width modulation signal, and output the drive signal from the output terminal OT. Here, the outputting the drive signal from the output terminal OT may represents that the drive signal (such as a drive current) flows from the output terminal OT to the light-emitting element 120, or may represent that the drive signal (such as the drive current) flows from the light-emitting element 120 into the output terminal OT, and a specific current direction is not limited.

Exemplarily, in some embodiments, when the drive signal is the drive current, the drive signal generation circuit may include a current source and a metal oxide semiconductor (MOS) field effect transistor (FET), and the metal oxide semiconductor field effect transistor is called an MOS transistor. A control electrode of the MOS transistor receives the pulse width modulation signal transmitted by the pulse width modulation circuit, thereby being turned on or off under the control of the pulse width modulation signal. A first electrode of the MOS transistor is connected with the output terminal OT, a second electrode of the MOS transistor is connected with a first electrode of the current source, and a second electrode of the current source is connected with the common voltage terminal GND to receive a common voltage. For example, the current source may be a constant current source.

When the pulse width modulation signal is an effective level, the MOS transistor is turned on, and the current source provides the drive current through the output terminal OT. When the pulse width modulation signal is an ineffective level, the MOS transistor is turned off, and in this case, the output terminal OT does not provide the drive current. A duration of the effective level of the pulse width modulation signal is equal to an active duration of the MOS transistor, and the active duration of the MOS transistor is equal to a duration of the drive current supply from the output terminal OT. Therefore, the light-emitting duration of the light-emitting elements 120 may further be controlled, and thus the visual light-emitting brightness is controlled. For example, in some embodiments, when the MOS transistor is turned on, the drive current flows from the OT terminal into the drive circuit 110, and then flows into the grounding terminal (such as the common voltage terminal GND) sequentially through the MOS transistor and the current source. It should be noted that in the embodiment of the disclosure, the drive signal generation circuit may further adopt other circuit structures, which is not limited in the embodiment of the disclosure.

Exemplarily, the relay signal generation circuit is further electrically connected with the output terminal OT, and is configured to generate a relay signal based on the relay control signal and output the relay signal from the output terminal OT. For example, the relay control signal corresponds to the subsequent address, the relay signal generated based on the relay control signal contains the subsequent address, and the subsequent address corresponds to other drive circuits 110. The relay signal is output from the output terminal OT, and then is provided to the first input terminal Di of the drive circuit 110 that is separately provided, and the relay signal is input to the drive circuit 110 that is separately provided as the first input signal, so that the drive circuit 110 that is separately provided obtains the corresponding address signal. The relay signal generation circuit may be implemented through a latch, a decoder, an encoder and the like, which is not limited in the embodiment of the disclosure.

It should be noted that in the embodiment of the disclosure, although the drive signal generation circuit and the relay signal generation circuit are both electrically connected with the output terminal OT, the drive signal generation circuit and the relay signal generation circuit output the drive signal and the relay signal respectively in different time periods, the drive signal and the relay signal are transmitted through the output terminal OT in a time-division mode, and therefore, they do not affect each other.

Exemplarily, the power supply circuit is electrically connected with the demodulator circuit and the data processing control circuit respectively, and is configured to receive the electrical energy and supply power to the data processing control circuit. For example, the second input signal is a power line carrier communication signal, after being demodulated by the demodulator circuit, the direct current power component (namely electrical energy) in the second input signal is transmitted to the power supply circuit, and then is supplied to the data processing control circuit by the power supply circuit. Of course, the embodiment of the disclosure is not limited to this, and the power supply circuit may further be electrically connected with other circuits in the drive circuit 110 to supply the electrical energy. The power supply circuit may be implemented through a switching circuit, a voltage converting circuit, a stabilizing circuit and the like, which is not limited in the embodiment of the disclosure.

It should be noted that in the embodiment of the disclosure, each drive circuit 110 may further include more circuits and parts, not limited to the above demodulator circuit, the physical layer interface circuit, the data processing control circuit, the pulse width modulation circuit, the drive signal generation circuit, the relay signal generation circuit and the power supply circuit, which may be determined according to functions required to be realized and is not limited in the embodiment of the disclosure.

Figure 4:
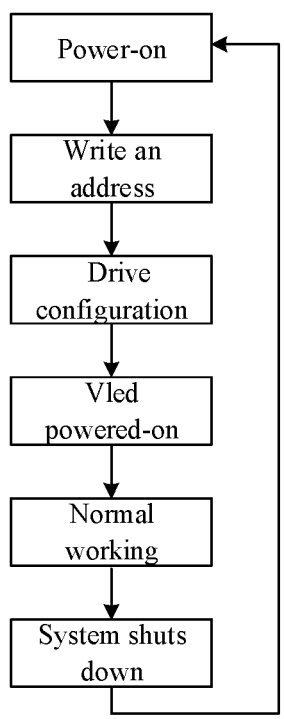
FIG. 4 is a working flowchart of a drive circuit according to some embodiments of the disclosure.
Figure 5:
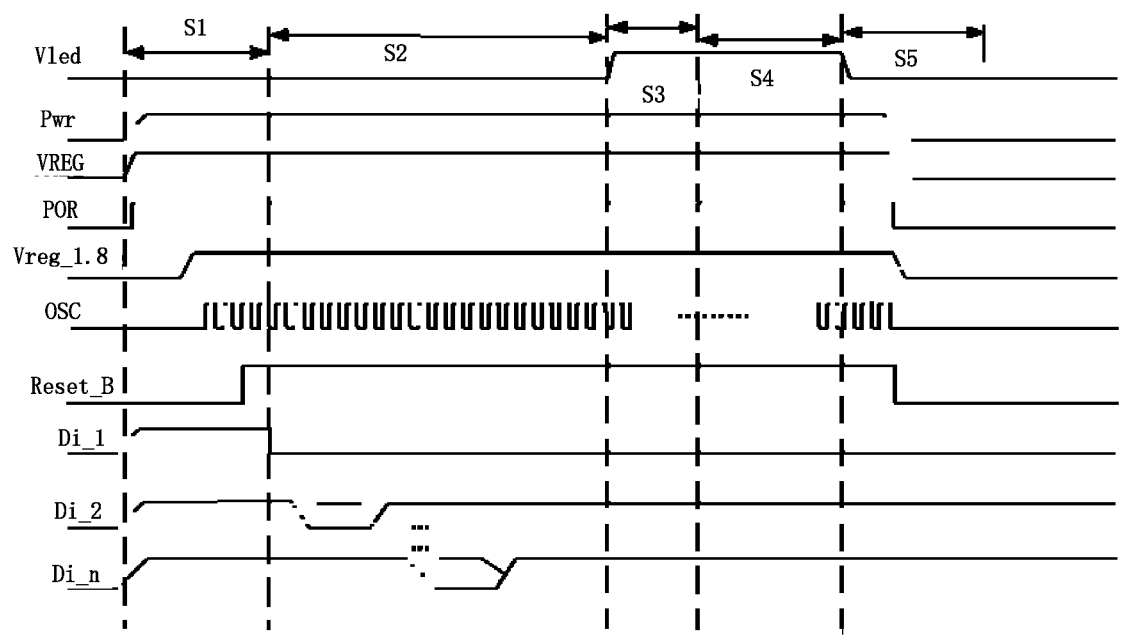
FIG. 5 is a timing diagram of signals for a drive circuit according to some embodiments of the disclosure.

FIG. 4 illustrates a working flowchart of a drive circuit 110, and FIG. 5 illustrates a timing diagram of signals for a drive circuit 110. As shown in FIG. 4 and FIG. 5, while the drive circuit 110 works, it is powered on firstly to complete initialization, and then an address writing operation is performed in a time period S1, that is, in the time period S1, a first input signal Di_1 is input to the drive circuit 110 through a first input terminal Di, so as to write an address. For example, the first input signal Di_1 is sent through a sender that is separately provided.

Then, in a time period S2, drive configuration is performed, and a relay signal Di_2 is output through an output terminal OT. For example, the relay signal Di_2 is input to a first input terminal Di of a drive circuit 110 that is separately provided as a first input signal. For example, the above first time period is the time period S2.

Then, in a time period S3, a drive voltage terminal Vled is powered on. For example, after a plurality of drive circuits 110 all obtain the corresponding addresses, it enters the time period S3 after approximately 10 microseconds. At this time, a drive voltage provided by the drive voltage terminal Vled changes into a high level.

Then, in a time period S4, the drive circuit 110 is in a normal working mode, the output terminal OT provides a drive signal (such as a drive current) according to the required duration, so that the light-emitting element 120 connected with the drive circuit 110 emits light according to the required duration. For example, the above second time period is the time period S4. For example, in a case of serving as a backlight unit of the display apparatus, the light-emitting substrate 10 of the drive circuit 110 is adopted to work in a local dimming mode, which may realize a high dynamic range effect.

Finally, in a time period S5, the system is turned off, that is, the drive circuit 110 is powered off, the drive voltage provided by the drive voltage terminal Vled changes into a low level, and the light-emitting element 120 stops emitting light.

It should be noted that the above working flow is only illustrative, but not restrictive, and the actual working flow of the drive circuit 110 may be determined according to the actual needs, which is not limited in the embodiment of the disclosure. In FIG. 5, VREG, POR, Vreg_1.8, OSC, Reset_B are all internal signals of the drive circuit 110, and will not be input or output through the first input terminal Di, the second input terminal Pwr, the output terminal OT and the common voltage terminal GND. Di_1 is the first input signal received by the drive circuit 110, Di_2 is the relay signal output by the drive circuit 110 (also is a first input signal received by a next connected drive circuit 110), and Di_n is a first input signal received by an $n^{th}$ drive circuit 110 in the plurality of drive circuits 110 which are sequentially connected.

Exemplarily, during specific implementation, the control circuit 110 may be set as a chip, a chip size (such as a length) may be several tens of micrometers, a chip area is about a few hundred square micrometers or even smaller, it is similar to the Mini-LED in size, and has a characteristic of miniaturization, which is easy to integrate into the light-emitting substrate 10 (such as being bonded and connected to a surface of the light-emitting substrate 10), a setting space of a printed circuit board is saved, a structure is simplified, and it is conducive to realizing lightness and thinness. Each control circuit 110 directly drives a light-emitting unit 100, and the problems such as complex operation and prone flickering in a row scanning control method are avoided. In addition, the drive circuit 110 has fewer ports, requires fewer signals, and has simple control methods, simple wiring methods and low costs.

In some embodiments, during specific implementation, as shown in FIG. 1 and FIG. 7, the light-emitting substrate may include a first signal line 210 located on the base substrate 01 and extending in a first direction F1. The drive circuits 110 in at least two different light-emitting units 100 in the first direction F1 are coupled with each other, and the first signal line 210 is coupled with the first input terminal Di of a drive circuit 110 in at least two drive circuits 110 that are coupled with each other. Exemplarily, the drive circuits 110 in at least two different light-emitting units 100 adjacent in a column direction may be coupled with each other, so that the drive circuits 110 may be arranged in a cascaded mode in the column direction. In addition, the first signal line 210 is coupled with the first input terminal Di of the drive circuit 110, so that the first input signal may be input to the first input terminal Di of the drive circuit 110 through the first signal line 210. In this way, the first signal line 210 is consistent with a cascaded direction of the drive circuits 110, an overlapping area of signals is reduced, and signal interference is reduced.

In some embodiments, during specific implementation, as shown in FIG. 1 and FIG. 7, the drive circuits 110 in the at least two different light-emitting units 100 are coupled with each other through at least one first connecting line 310. Exemplarily, the drive circuits 110 in the two different light-emitting units 100 may be coupled with each other through one first connecting line 310.

In some embodiments, during specific implementation, as shown in FIG. 1 and FIG. 5, in the at least two drive circuits 110 that are coupled with each other, the output terminal OT of the drive circuit 110 coupled with the first signal line 210 is coupled with the first input terminal Di of a drive circuit 110 in other drive circuits 110 through the first connecting line 310.

Exemplarily, the plurality of light-emitting units 100 in the light-emitting substrate 10 may be arranged into N rows and M columns and divided into a plurality of groups, each light-emitting unit group 100 may include N rows and Y columns, with a total of N*Y light-emitting units 100, and one first signal line 210 corresponds to one light-emitting unit group. Exemplarily, the light-emitting units 100 may be divided into M/Y groups. Where, N is an integer greater than 0, M is an integer greater than 0, 0<Y≤M and Y is an integer. For example, if Y=2, the two adjacent columns of light-emitting units 100 may form a light-emitting unit group. The two adjacent columns of light-emitting units 100 may correspond to one first signal line 210. For example, as shown in FIG. 1, a first column of light-emitting units 100 and a second column of light-emitting units 100 may form a first light-emitting unit group FGZ-1, and a third column of light-emitting units 100 and a fourth column of light-emitting units 100 may form a second light-emitting unit group FGZ-2. Then, the first light-emitting unit group FGZ-1 corresponds to a first signal line 210, and the second light-emitting unit group FGZ-2 corresponds to another first signal line 210. In this way, the quantity of the first signal lines 210 in the light-emitting substrate 10 may be M/2.

For example, in an example shown in FIG. 1, taking N=4 as an example, each light-emitting unit group 100 may include 4 rows and 2 columns, with a total of 8 light-emitting units 100. Of course, in practical applications, specific values of M, N and Y may be designed and determined according to the needs of the practical applications, which is not limited here.

Exemplarily, in the same light-emitting unit group, N*Y light-emitting units 100 are sequentially numbered according to row and column distribution positions. The first input terminal Di of the drive circuit 110 of the light-emitting unit 100 with index of 1 is electrically connected with the first signal line 210 corresponding to the light-emitting unit group 100, and the output terminal OT of the drive circuit 110 of the light-emitting unit 100 with index of P is electrically connected with the first input terminal Di of the drive circuit 110 of the light-emitting unit 100 with index of (P+1) through the first connecting line 310, where, 0<P<N*Y and P is an integer. For example, the light-emitting units 100 arranged in the column direction may be electrically connected in a cascaded mode through the first connecting line 310.

Figure 6:
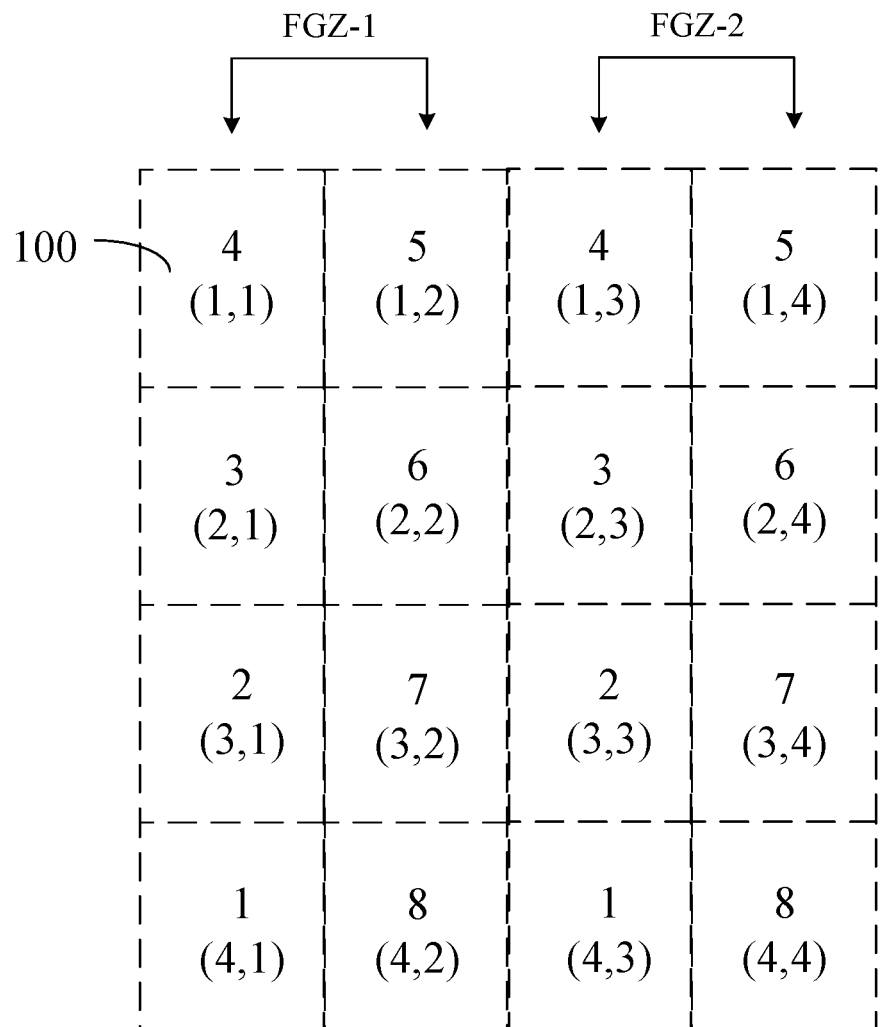
FIG. 6 is a schematic diagram of a numbering mode of light-emitting units of a light-emitting substrate according to some embodiments of the disclosure.

For example, in some embodiments, as shown in FIG. 6, the N*Y light-emitting units 100 may be sequentially numbered according to a shape like the letter n. Each dashed rectangular frame in FIG. 6 represents a light-emitting unit 100, and the index of each light-emitting unit 100 is labeled in each rectangle. With reference to FIG. 1 and FIG. 6, in the same light-emitting unit group, the light-emitting unit 100 with index of 1 and the light-emitting unit 100 with index of (N*Y) are arranged adjacent to each other in the second direction F2, and are two light-emitting units closest to a bonding region FB in the light-emitting unit group; and the output terminal OT of the drive circuit 110 of the light-emitting unit 100 with index of (N*Y/2) and the drive circuit 110 of the light-emitting unit 100 with index of (N*Y/2+1) are arranged adjacent to each other in the second direction. In addition, when 1≤P≤N*Y/2−1, the output terminal OT of the drive circuit of the light-emitting unit with index of P and the first input terminal Di of the drive circuit of the light-emitting unit with index of (P+1) are sequentially and electrically connected in the first direction F1. When N*Y/2+1≤P≤N*Y−1, the output terminal OT of the drive circuit of the light-emitting unit with index of P and the first input terminal Di of the drive circuit of the light-emitting unit with index of (P+1) are sequentially and electrically connected in the first direction F1.

For example, in the same light-emitting unit group, the light-emitting unit 100 with index of 1 and the light-emitting unit 100 with index of 8 are arranged adjacent to each other in the second direction F2, and the output terminal OT of the drive circuit 110 of the light-emitting unit 100 with index of 4 and the drive circuit 110 of the light-emitting unit 100 with index of 5 are arranged adjacent to each other in the second direction. The output terminal OT of the drive circuit of the light-emitting unit 100 with index of 1 is electrically connected with the first input terminal Di of the drive circuit of the light-emitting unit with index of 2. The output terminal OT of the drive circuit of the light-emitting unit 100 with index of 2 is electrically connected with the first input terminal Di of the drive circuit of the light-emitting unit with index of 3. The output terminal OT of the drive circuit of the light-emitting unit 100 with index of 3 is electrically connected with the first input terminal Di of the drive circuit of the light-emitting unit with index of 4. The output terminal OT of the drive circuit of the light-emitting unit 100 with index of 4 is electrically connected with the first input terminal Di of the drive circuit of the light-emitting unit with index of 5. The output terminal OT of the drive circuit of the light-emitting unit 100 with index of 5 is electrically connected with the first input terminal Di of the drive circuit of the light-emitting unit with index of 6. The output terminal OT of the drive circuit of the light-emitting unit 100 with index of 6 is electrically connected with the first input terminal Di of the drive circuit of the light-emitting unit with index of 7. The output terminal OT of the drive circuit of the light-emitting unit 100 with index of 7 is electrically connected with the first input terminal Di of the drive circuit of the light-emitting unit with index of 8.

In some embodiments, as shown in FIG. 1 and FIG. 7, the light-emitting substrate further includes an output line 220; the output line 220 extends in the first direction F1; and a light-emitting unit group corresponds to an output line 220, and the output terminal OT of the drive circuit 110 of the light-emitting unit 100 with index of (N*Y) is electrically connected with the output line 220.

For example, with reference to FIG. 1 and FIG. 6, in the first light-emitting unit group FGZ-1 consisting of the first column of light-emitting units 100 and the second column of light-emitting units 100, the first input terminal Di of the drive circuit 110 of the light-emitting unit 100 with index of 1 is electrically connected with the first signal line 210 corresponding to the first light-emitting unit group FGZ-1, and the output terminal OT of the drive circuit 110 of the light-emitting unit 100 with index of (N*Y) is electrically connected with the output line 220 corresponding to the first light-emitting unit group FGZ-1. The output terminal OT of the drive circuit 110 of the light-emitting unit 100 with index of P is electrically connected with the first input terminal Di of the drive circuit 110 of the light-emitting unit 100 with index of (P+1) through a first connecting line 310, that is, the first input terminal Di of the drive circuit 110 of the light-emitting unit 100 with index of (P+1) receives a relay signal output by the output terminal OT of the drive circuit 110 of the light-emitting unit 100 with index of P as a first input signal. In the second light-emitting unit group FGZ-2 consisting of the third column of light-emitting units 100 and the fourth column of light-emitting units 100, the first input terminal Di of the drive circuit 110 of the light-emitting unit 100 with index of 1 is electrically connected with the first signal line 210 corresponding to the second light-emitting unit group FGZ-2, and the output terminal OT of the drive circuit 110 of the light-emitting unit 100 with index of (N*Y) is electrically connected with the output line 220 corresponding to the second light-emitting unit group FGZ-2. The output terminal OT of the drive circuit 110 of the light-emitting unit 100 with index of P is electrically connected with the first input terminal Di of the drive circuit 110 of the light-emitting unit 100 with index of (P+1) through a first connecting line 310, that is, the first input terminal Di of the drive circuit 110 of the light-emitting unit 100 with index of (P+1) receives a relay signal output by the output terminal OT of the drive circuit 110 of the light-emitting unit 100 with index of P as a first input signal.

For example, with reference to FIG. 1, and FIG. 6 to FIG. 8B, taking the first light-emitting unit group FGZ-1 as an example, in the first light-emitting unit group FGZ-1, the light-emitting unit 100 with index of 1 is located in a fourth row and first column, the light-emitting unit 100 with index of 2 is located in a third row and first column, the light-emitting unit 100 with index of 3 is located in a second row and first column, the light-emitting unit 100 with index of 4 is located in a first row and first column, the light-emitting unit 100 with index of 5 is located in a first row and second column, the light-emitting unit 100 with index of 6 is located in a second row and second column, the light-emitting unit 100 with index of 7 is located in a third row and second column, and the light-emitting unit 100 with index of 8 is located in a fourth row and second column. The first input terminal Di of the drive circuit 110 of the light-emitting unit 100 with index of 1 is electrically connected with a first signal line 210 corresponding to the first light-emitting unit group FGZ-1. The first input terminal Di of the drive circuit 110 of the light-emitting unit 100 with index of 2 is electrically connected with the output terminal OT of the drive circuit 110 of the light-emitting unit 100 with index of 1 through a first connecting line 310. The first input terminal Di of the drive circuit 110 of the light-emitting unit 100 with index of 3 is electrically connected with the output terminal OT of the drive circuit 110 of the light-emitting unit 100 with index of 2 through a first connecting line 310. The first input terminal Di of the drive circuit 110 of the light-emitting unit 100 with index of 4 is electrically connected with the output terminal OT of the drive circuit 110 of the light-emitting unit 100 with index of 3 through a first connecting line 310. The first input terminal Di of the drive circuit 110 of the light-emitting unit 100 with index of 5 is electrically connected with the output terminal OT of the drive circuit 110 of the light-emitting unit 100 with index of 4 through a first connecting line 310. The first input terminal Di of the drive circuit 110 of the light-emitting unit 100 with index of 6 is electrically connected with the output terminal OT of the drive circuit 110 of the light-emitting unit 100 with index of 5 through a first connecting line 310. The first input terminal Di of the drive circuit 110 of the light-emitting unit 100 with index of 7 is electrically connected with the output terminal OT of the drive circuit 110 of the light-emitting unit 100 with index of 6 through a first connecting line 310. The first input terminal Di of the drive circuit 110 of the light-emitting unit 100 with index of 8 is electrically connected with the output terminal OT of the drive circuit 110 of the light-emitting unit 100 with index of 7 through a first connecting line 310. The output terminal OT of the drive circuit 110 of the light-emitting unit 100 with index of 8 is electrically connected with the output line 220 corresponding to the first light-emitting unit group FGZ-1. The remaining is distributed in the same way and so on, which is not repeated here.

In some embodiments, during specific implementation, as shown in FIG. 1 and FIG. 7, the light-emitting substrate may further include a second signal line 230; and the second signal line 230 is electrically connected with a second input terminal Pwr of the drive circuit 110. In this way, a second input signal may be transmitted to the second input terminal Pwr of the drive circuit 110 through the second signal line 230.

In some embodiments, during specific implementation, as shown in FIG. 1 and FIG. 7, the second signal line 230 may extend in the first direction F1. In this way, the first signal line 210 and the second signal line 230 may extend in the same direction, which facilitates wiring design.

In some embodiments, during specific implementation, as shown in FIG. 1 and FIG. 7, a plurality of second signal lines 230 may be arranged, in order to reduce the quantity of the second signal lines 230 as much as possible and reduce a trace density, the second input terminals Pwr of all drive circuits 110 in a light-emitting unit group may be all electrically connected with the same second signal line 230. That is, one light-emitting unit group corresponds to one second signal line 230. For example, the first light-emitting unit group FGZ-1 corresponds to a second signal line 230, and the second input terminals Pwr of all drive circuits 110 in the first light-emitting unit group FGZ-1 are all electrically connected with the corresponding second signal line 230. The second light-emitting unit group FGZ-2 corresponds to another second signal line 230, and the second input terminals Pwr of all drive circuits 110 in the second light-emitting unit group FGZ-2 are all electrically connected with the corresponding second signal line 230. In this way, the quantity of the second signal lines in the light-emitting substrate 10 may be M/2.

In some embodiments, during specific implementation, as shown in FIG. 1 and FIG. 7, a light-emitting unit group includes two columns of light-emitting units 100. In addition, in the same light-emitting unit group, the first connecting line 310 used for coupling the drive circuits 110 is arranged to surround the second signal line 230. In this way, extension directions of most of the first connecting lines 310 and the second signal line 230 are consistent, the wiring space is reasonably designed, and signal interference is reduced.

In some embodiments, during specific implementation, as shown in FIG. 1 and FIG. 7, the light-emitting substrate may further include: a common voltage signal line 250 electrically connected with the common voltage terminal GND, and a drive signal line 240 electrically connected with the drive voltage terminal Vled; and the common voltage signal line 250 and the drive signal line 240 both extend in the first direction F1. In this way, a drive voltage is transmitted to the drive circuit 110 through the drive signal line 240, and a common voltage is transmitted to the drive circuit 110 through the common voltage signal line 250. In this way, extension directions of the common voltage signal line 250, the drive signal line 240, the first signal line 210, the second signal line 230 and most of the first connecting lines 310 are consistent, the trace space is reasonably designed, and the signal interference is reduced.

In some embodiments, during specific implementation, as shown in FIG. 1 and FIG. 7, one column of light-emitting units 100 corresponds to one common voltage signal line 250 and one drive signal line 240. That is, the common voltage terminals GND of the drive circuits 110 in a column of light-emitting units 100 are all electrically connected with the same common voltage signal line 250, and the drive voltage terminals Vled in a column of light-emitting units 100 are all electrically connected with the same drive signal line 240.

In some embodiments, during specific implementation, as shown in FIG. 1 and FIG. 7, as for the common voltage signal line 250, the drive signal line 240 and the second signal line corresponding to a column of light-emitting units 100, the common voltage signal line 250 is located between the drive signal line 240 and the second signal line. Exemplarily, a width of the common voltage signal line 250 in the second direction F2 is greater than a width of the drive signal line 240 in the second direction F2. The width of the drive signal line 240 in the second direction F2 is greater than a width of the second signal line in the second direction F2. The width of the second signal line in the second direction F2 is greater than a width of the first signal line in the second direction F2. The width of the first signal line in the second direction F2 is approximately equal to a width of the first connecting line in the second direction F2.

In some embodiments, during specific implementation, as shown in FIG. 1 and FIG. 7, a light-emitting unit group may include two columns of light-emitting units 100. In addition, orthographic projections of two drive signal lines (such as 240 and 240') corresponding to the same light-emitting unit group on the base substrate 01 are arranged symmetrically with respect to an orthographic projection of the second signal line 230 on the base substrate 01. For example, in the first light-emitting unit group FGZ-1, the orthographic projections of the two drive signal lines (such as 240 and 240') on the base substrate 01 are arranged symmetrically with respect to the orthographic projection of the second signal line 230 on the base substrate 01. In the second light-emitting unit group FGZ-2, the orthographic projections of the two drive signal lines (such as 240 and 240') on the base substrate 01 are symmetric in respect to the orthographic projection of the second signal line 230 on the base substrate 01.

In some embodiments, during specific implementation, as shown in FIG. 1 and FIG. 7, a light-emitting unit group includes two columns of light-emitting units 100. In addition, orthographic projections of two common voltage signal lines (such as 250 and 250') corresponding to the same light-emitting unit group on the base substrate 01 are symmetric in respect to the orthographic projection of the second signal line 230 on the base substrate 01. For example, in the first light-emitting unit group FGZ-1, the orthographic projections of the two common voltage signal lines (such as 250 and 250') on the base substrate 01 are symmetric in respect to the orthographic projection of the second signal line 230 on the base substrate 01. In the second light-emitting unit group FGZ-2, the orthographic projections of the two common voltage signal lines (such as 250 and 250') on the base substrate 01 are symmetric in respect to the orthographic projection of the second signal line 230 on the base substrate 01. In this way, patterning is facilitated, and design difficulty is reduced.

In some embodiments, during specific implementation, as shown in FIG. 7, the first signal line 210, the second signal line 230, the common voltage signal line 250 and the drive signal line 240 may be disposed in the same layer. In this way, the same patterning process may be adopted to form patterns of the first signal line 210, the second signal line 230, the common voltage signal line 250 and the drive signal line 240, that is, after a one-time film forming process, the patterns of the first signal line 210, the second signal line 230, the common voltage signal line 250 and the drive signal line 240 are formed in one time through the patterning process, and the process difficulty is reduced.

Figure 8A:
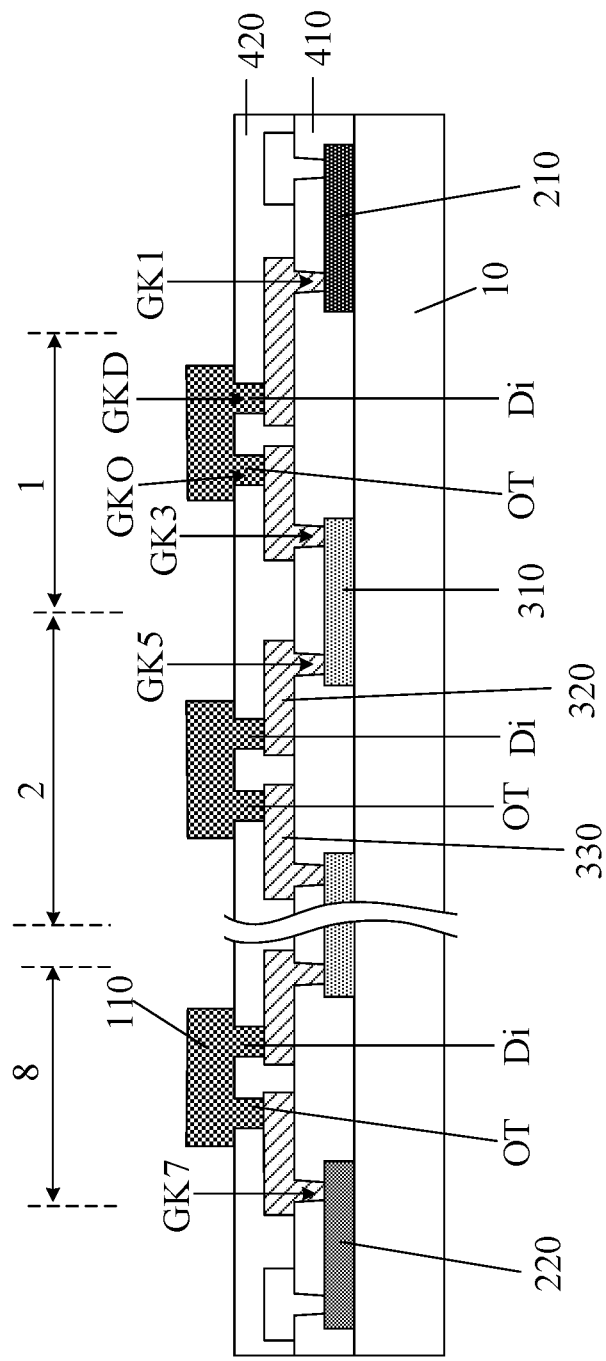
FIG. 8A is a partial sectional view of a light-emitting substrate according to some embodiments of the disclosure.

In some embodiments, during specific implementation, as shown in FIG. 8A, the first connecting line 310 and the first signal line 210 may be disposed in the same layer. In this way, the same patterning process may be adopted to form patterns of the first connecting line 310 and the first signal line 210, that is, after a one-time film forming process, the patterns of the first connecting line 310 and the first signal line 210 are formed in one time through the patterning process, and the process difficulty is reduced.

In some embodiments, during specific implementation, as shown in FIG. 8A, the output line 220 and the first signal line 210 may be disposed in the same layer. In this way, after a one-time film forming process, patterns of the output line 220 and the first signal line 210 may be formed in one time through a patterning process, and the process difficulty is reduced.

Exemplarily, a material of a layer where the first signal line is located may be a metal material, such as, any one or an alloy of at least two of copper, molybdenum, titanium, aluminum and nickel.

In some embodiments, during specific implementation, as shown in FIG. 7 and FIG. 8A, the light-emitting substrate further includes a first insulating layer disposed on a side of a layer where the first signal line 210 is located facing away from the base substrate 01, a plurality of second connecting lines 320 and a plurality of third connecting lines 330 which are disposed on a side of the first insulating layer facing away from the base substrate 01, a second insulating layer disposed on a side of the second connecting line 320 facing away from the base substrate 01, and drive circuits 110 and light-emitting elements 120 which are disposed on a side of the second insulating layer facing away from the base substrate 01. The first input terminal Di of a drive circuit 110 corresponds to a second connecting line 320, and the output terminal OT of a drive circuit 110 corresponds to a third connecting line 330. Exemplarily, the first input terminal Di of the drive circuit 110 of the light-emitting unit 100 with index of 1 may be electrically connected with the corresponding second connecting line 320 through a first input via hole GKD running through the second insulating layer, and the second connecting line 320 is electrically connected with the corresponding first signal line 210 through a first via hole GKI running through the first insulating layer. The output terminal OT of the drive circuit 110 of the light-emitting unit 100 with index of P may be electrically connected with the corresponding third connecting line 330 through an output via hole GKO running through the second insulating layer, and the third connecting line 330 is electrically connected with the corresponding first connecting line 310 through a third via hole GK3 running through the first insulating layer. The first input terminal Di of the drive circuit 110 of the light-emitting unit 100 with index of (P+1) may be electrically connected with the corresponding second connecting line 320 through the first input via hole GKD running through the second insulating layer, and the second connecting line 320 is electrically connected with the corresponding first connecting line 310 through a fifth via hole GK5 running through the first insulating layer. The output terminal OT of the drive circuit 110 of the light-emitting unit 100 with index of N*Y may be electrically connected with the corresponding third connecting line 330 through the output via hole GKO running through the second insulating layer, and the third connecting line 330 is electrically connected with the corresponding output line 220 through a seventh via hole GK7 running through the first insulating layer.

Exemplarily, a material of a layer where the second connecting line is located may be a metal material, such as any one or an alloy of at least two of copper, molybdenum, titanium, aluminum and nickel.

In some embodiments, during specific implementation, as shown in FIG. 7, the light-emitting substrate further includes a plurality of fourth connecting lines 340 and a plurality of fifth connecting lines 350 which are disposed in the same layer as the second connecting lines 320. The second input terminal Pwr of a drive circuit 110 corresponds to a fourth connecting line 340, and the common voltage terminal GND of the drive circuit 110 corresponds to a fifth connecting line 350. The second input terminal Pwr of the drive circuit 110 in each light-emitting unit 100 may be electrically connected with the corresponding fourth connecting line 340 through a second input via hole GKP running through the second insulating layer, and the fourth connecting line 340 may be electrically connected with the corresponding second signal line 230 through a ninth via hole running through the first insulating layer. The common voltage terminal GND of the drive circuit 110 in each light-emitting unit 100 may be electrically connected with the corresponding fifth connecting line 350 through a common voltage via hole GKG running through the second insulating layer, and the fifth connecting line 350 may be electrically connected with the corresponding common voltage signal line 250 through an eleventh via hole running through the first insulating layer.

In some embodiments, during specific implementation, as shown in FIG. 7, the light-emitting substrate further includes a plurality of sixth connecting lines 360 disposed in the same layer as the second connecting lines 320. The drive voltage terminal Vled of a light-emitting unit 100 corresponds to a sixth connecting line 360. One end of the sixth connecting line 360 in each light-emitting unit 100 is electrically connected with the corresponding drive signal line 240 through a drive via hole GKV running through the first insulating layer, and the other end of the sixth connecting line 360 in each light-emitting unit 100 is electrically connected with an anode or a cathode of the corresponding light-emitting element 120 through a via hole GKY for light-emitting that runs through the second insulating layer.

In some embodiments, during specific implementation, as shown in FIG. 7, the light-emitting substrate may further include a plurality of seventh connecting lines 370 disposed in the same layer as the second connecting lines 320. A light-emitting group corresponds to a plurality of seventh connecting lines 370, and light-emitting elements in the light-emitting group may be sequentially connected in series through the seventh connecting lines 370. In addition, the seventh connecting lines 370 are further electrically connected with anodes or cathodes of the corresponding light-emitting elements 120 through the via hole GKY for light emitting that runs through the second insulating layer.

In some embodiments, during specific implementation, as shown in FIG. 7, the light-emitting substrate may further include a plurality of first auxiliary lines 510 disposed in the same layer as the second connecting lines 320. The first auxiliary lines 510 extend in the second direction F2 and are arranged in the first direction F1. In addition, an orthographic projection of each first auxiliary line 510 on the base substrate 01 is located between orthographic projections of two adjacent rows of light-emitting units 100 on the base substrate 01. Each first auxiliary line 510 is electrically connected with each drive signal line 240 through a first auxiliary via hole 511 running through the first insulating layer. In this way, a parallel structure may be formed through the first auxiliary lines 510 and the drive signal line 240, resistance of the drive signal line 240 is reduced, the impact of voltage drop on light emitting is reduced, and uniformity of light emitting is improved.

In some embodiments, during specific implementation, as shown in FIG. 7, the light-emitting substrate may further include a plurality of second auxiliary lines 520 disposed in the same layer as the second connecting lines 320. The second auxiliary lines 520 extend in the second direction F2 and are arranged in the first direction F1. In addition, an orthographic projection of each second auxiliary line 520 on the base substrate 01 is located between the orthographic projections of two adjacent rows of light-emitting units 100 on the base substrate 01. Each second auxiliary line 520 is electrically connected with each common voltage signal line 250 through a second auxiliary via hole 521 running through the first insulating layer. In this way, a parallel structure may be formed through the second auxiliary lines 520 and the common voltage signal line 250, resistance of the common voltage signal line 250 is reduced, the impact of voltage drop on light emitting is reduced, and the uniformity of light emitting is improved.

In some embodiments, during specific implementation, as shown in FIG. 7, the first auxiliary lines 510 and the second auxiliary lines 520 may be arranged alternately in the first direction F1. Exemplarily, the orthographic projection of each first auxiliary line 510 on the base substrate 01 is located between orthographic projections of the light-emitting elements in the two adjacent rows of light-emitting units 100 on the base substrate 01. The orthographic projection of each second auxiliary line 520 on the base substrate 01 is located between the orthographic projections of the light-emitting elements of the two adjacent rows of light-emitting units 100 on the base substrate 01. Exemplarily, the orthographic projection of each first auxiliary line 510 on the base substrate 01 is located between orthographic projections of the drive circuits in the two adjacent rows of light-emitting units 100 on the base substrate 01. The orthographic projection of each second auxiliary line 520 on the base substrate 01 is located between the orthographic projections of the drive circuits in the two adjacent rows of light-emitting units 100 on the base substrate 01.

Figure 8B:
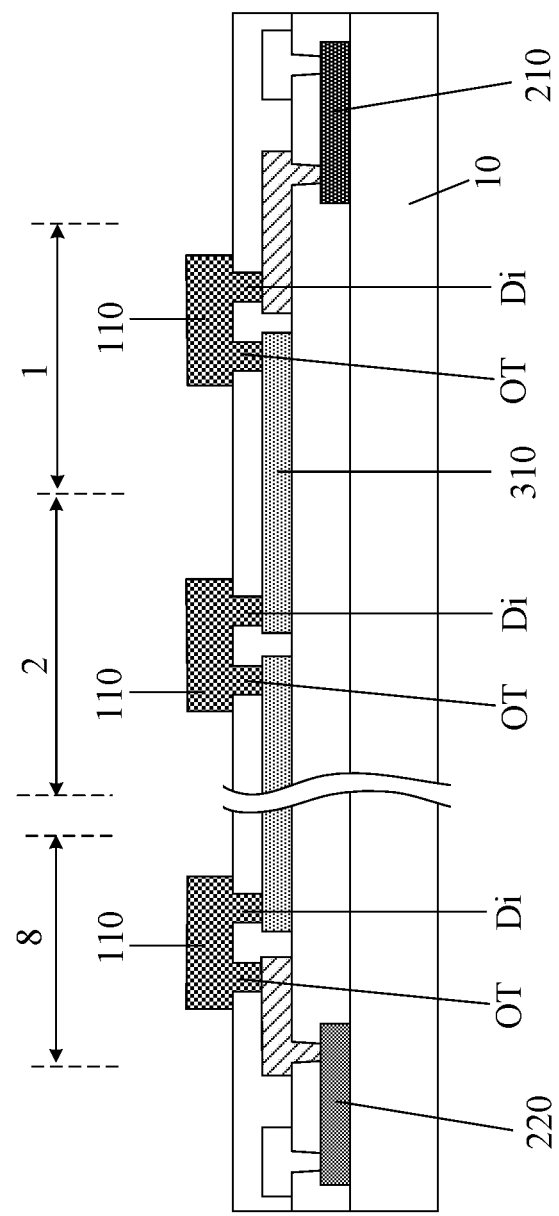
FIG. 8B is another partial sectional view of a light-emitting substrate according to some embodiments of the disclosure.

Alternatively, in some embodiments, during specific implementation, as shown in FIG. 8B, the first connecting lines 310 may be disposed on a side of the first signal line 210 facing away from the base substrate 01. In this way, the first connecting lines 310 are disposed in a layer different from the first signal line 210, so that signal interference caused by dense wiring on the same layer is reduced.

Alternatively, in some embodiments, during specific implementation, the output line 220 may be located on the side of the first signal line 210 facing away from the base substrate 01. In this way, the output line 220 is disposed in a layer different from the first signal line 210, so that the signal interference caused by dense wiring on the same layer is reduced.

It should be noted that FIG. 7 only illustrates a top view of a light-emitting substrate bonded with a drive circuit 110 but no light-emitting element. With reference to FIG. 7, a drive circuit 110 that is bonded and connected with a corresponding bonding pad is only illustrated in a light-emitting unit at coordinates (1, 1), and the drive circuit is not illustrated in other light-emitting units, but only a bonding pad to be bound with the drive circuit is illustrated. It can be understood that the bonding pad to be bound with the drive circuit is a region exposed by a plurality of output via holes GKO, GKP, GKD and GKG that penetrate through the second insulating layer.

That is, in other positions where the drive circuit needs to be bonded, only the exposed bonding pad region to be bonded with the drive circuits is illustrated, and subsequently, the drive circuits will be bonded and connected with these bonding pads. Similarly, the exposed bonding pad region to be bound with the light-emitting elements is only illustrated, and subsequently, the light-emitting elements will be bonded and connected with these bonding pads. It can be understood that the bonding pads to be bonded with the light-emitting elements are a region exposed by a plurality of output via holes GKY that run through the second insulating layer.

Exemplarily, in a preparation process, positions of the bonding pads used for bonding the drive circuits and the bonding pads used for bonding the light-emitting elements need to be exposed, and in order to ensure good electrical connection and transmission, the bonding pads are usually prepared by metal materials. In order to improve the problem that the metal materials are oxidized, an anti-oxidation layer covering the bonding pad may be arranged on the bonding pad. Exemplarily, a material of the anti-oxidation layer may be, for example, a copper-nickel alloy, nickel metal, or indium tin oxide and the like. In this way, the anti-oxidation layer is at least arranged in the bonding pad region to improve the problem that the bonding pads are oxidized.

Figure 9:
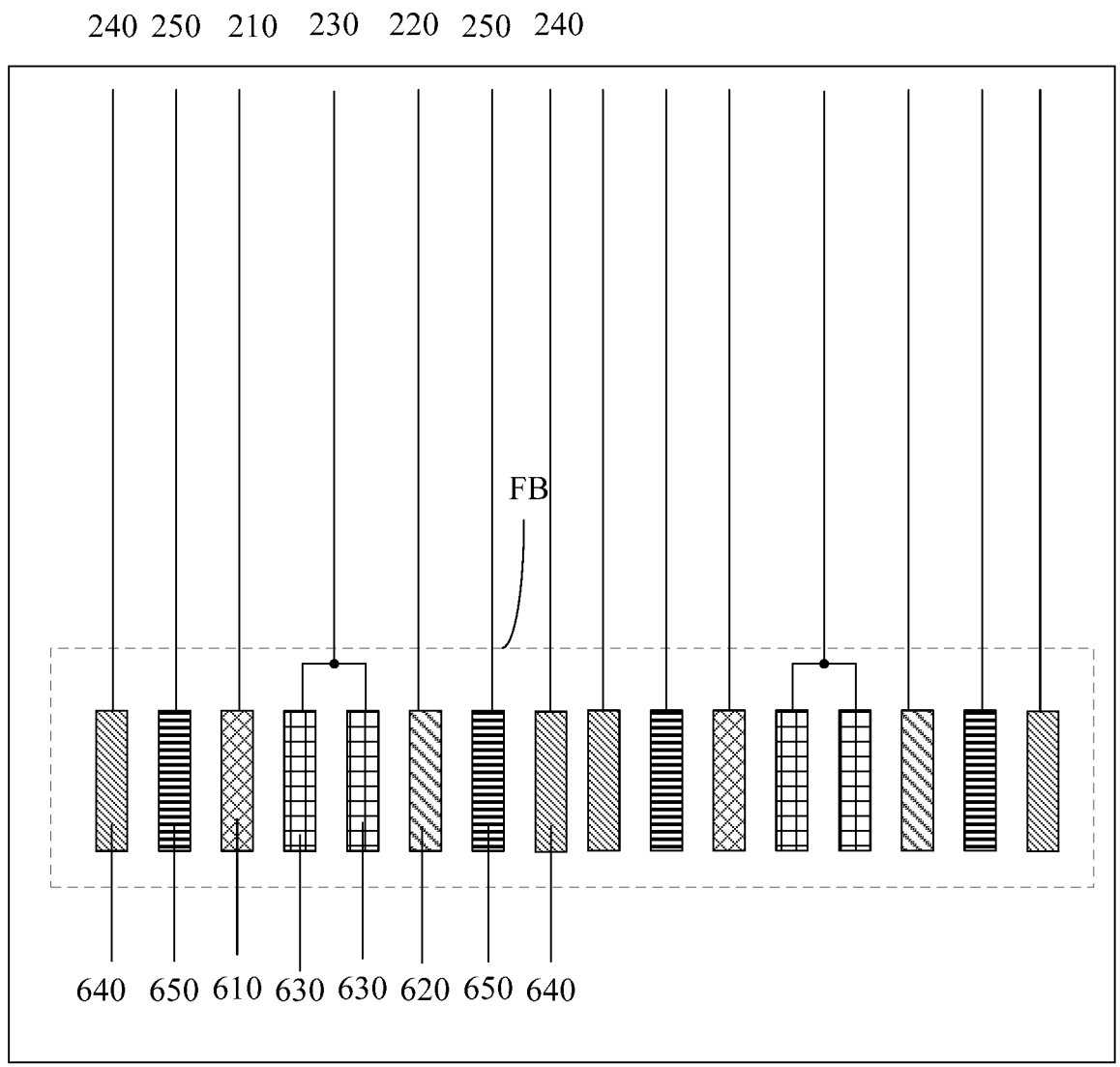
FIG. 9 is a simplified schematic structural diagram of a light-emitting substrate according to some embodiments of the disclosure.

In some embodiments, during specific implementation, as shown in FIG. 1 and FIG. 9, the light-emitting substrate may further include a bonding region FB, and the bonding region FB may include a plurality of signal terminals arranged mutually at intervals. Exemplarily, the plurality of signal terminals may include a plurality of first signal terminals. A first signal line may be electrically connected with at least one first signal terminal. For example, a first signal line 210 may be electrically connected with a first signal terminal 610, or a first signal line 210 may be electrically connected with at least two first signal terminals. Of course, in practical applications, the quantity of the first signal terminals connected with the first signal line may be designed and determined according to the needs of the practical applications, which is not limited here.

In some embodiments, during specific implementation, as shown in FIG. 1 and FIG. 9, the plurality of signal terminals may include: a plurality of output signal terminals. An output line is electrically connected with at least one output signal terminal. For example, an output line 220 may be electrically connected with an output signal terminal 620, or an output line may be electrically connected with at least two output signal terminals. Of course, in practical applications, the quantity of the output signal terminals connected with the output line 220 may be designed and determined according to the needs of the practical applications, which is not limited here.

In some embodiments, during specific implementation, as shown in FIG. 1 and FIG. 9, the plurality of signal terminals may include: a plurality of second signal terminals. A second signal line may be electrically connected to at least one second signal terminal. For example, a second signal line 230 may be electrically connected with a second signal terminal 630, or a second signal line 230 may be electrically connected with at least two second signal terminals. Of course, in practical applications, the quantity of the second signal terminals connected with the second signal line 230 may be designed and determined according to the needs of the practical applications, which is not limited here.

Similarly, in some embodiments, as shown in FIG. 1 and FIG. 9, the plurality of signal terminals may include: a plurality of drive signal terminals and a plurality of common voltage signal terminals. A drive signal line 240 is electrically connected with at least one drive signal terminal; and a common voltage signal line 250 is electrically connected with at least one common voltage signal terminal.

In some embodiments, during specific implementation, as shown in FIG. 1, FIG. 7 and FIG. 9, a drive signal terminal, a common voltage signal terminal, a first signal terminal, a second signal terminal and an output signal terminal which are connected with two drive signal lines 240, two common voltage signal lines 250, a first signal line 210, a second signal line 230 and an output line 220 corresponding to a light-emitting unit group may be taken as a terminal unit group, that is, a light-emitting unit group corresponds to a terminal unit group. In addition, in a terminal unit group, the drive signal terminal, the common voltage signal terminal, the first signal terminal, the second signal terminal, the output signal terminal, the common voltage signal terminal and the drive signal terminal may be arranged sequentially according to an order of the drive signal line 240, the common voltage signal line 250, the first signal line 210, the second signal line 230, the output line 220, the common voltage signal line 250 and the drive signal line 240 in the light-emitting unit group in the second direction F2. For example, in the first light-emitting unit group FGZ-1, the drive signal line 240, the common voltage signal line 250, the first signal line 210, the second signal line 230, the output line 220, the common voltage signal line 250 and the drive signal line 240 are sequentially arranged in the second direction F2, and the drive signal terminal, the common voltage signal terminal, the first signal terminal, the second signal terminal, the output signal terminal, the common voltage signal terminal and the drive signal terminal corresponding to the first light-emitting unit group FGZ-1 are also sequentially arranged in the second direction F2.

In some embodiments, during specific implementation, as shown in FIG. 1, FIG. 7 and FIG. 9, one light-emitting unit group may correspond to one terminal unit group, when a plurality of light-emitting unit groups are repeated and arranged at intervals in the second direction, the corresponding terminal unit groups may also be repeated and arranged at intervals in the second direction.

Figure 10:
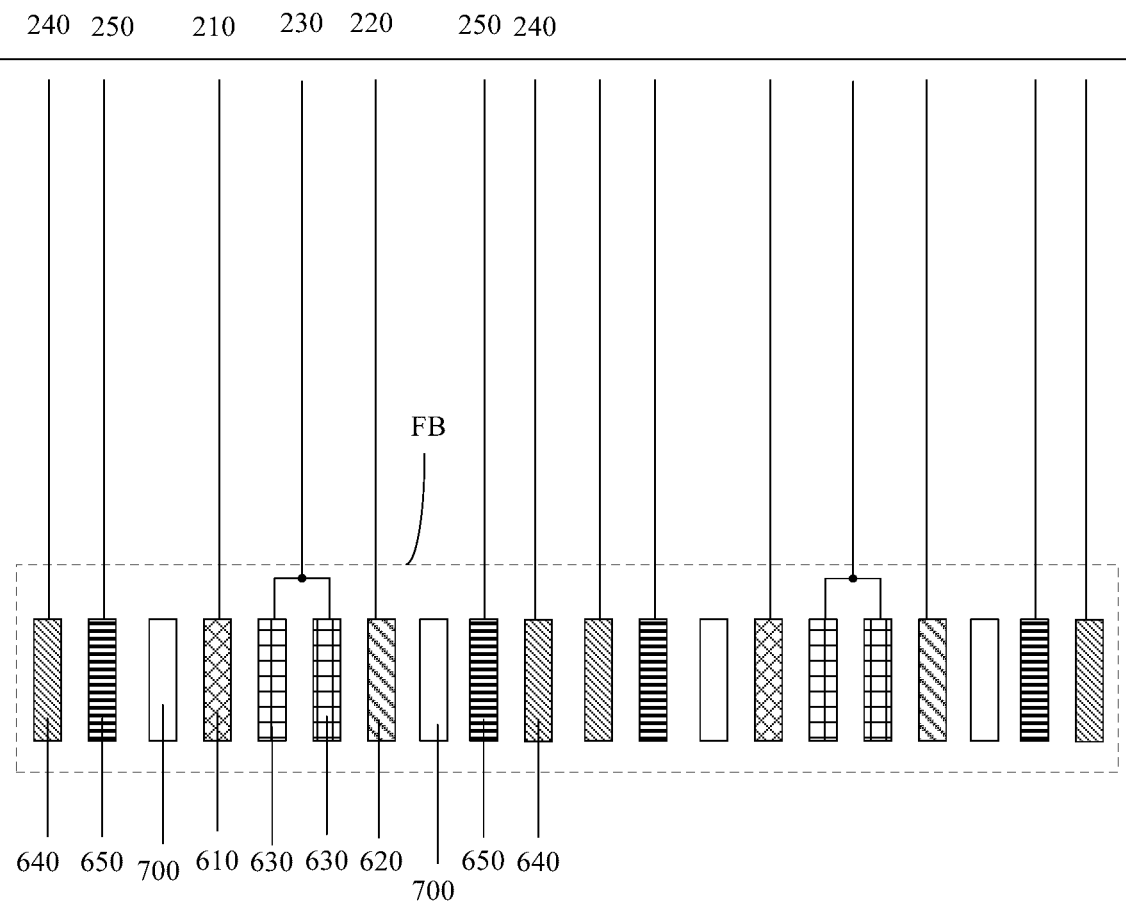
FIG. 10 is another simplified schematic structural diagram of a light-emitting substrate according to some embodiments of the disclosure.

In some embodiments, during specific implementation, as shown in FIG. 1, FIG. 7 and FIG. 10, the plurality of signal terminals further include dummy signal terminals. As for the first signal terminal and the common voltage signal terminal corresponding to the same light-emitting unit group, a dummy signal terminal is arranged between the first signal terminal and the common voltage signal terminal. By arranging the dummy signal terminals, it may be ensured that the signal terminals arranged in a fan-out region are evenly distributed, and the risk of signal interference between the first signal terminal and the common voltage signal terminal may also be reduced.

In some embodiments, during specific implementation, as shown in FIG. 1, FIG. 7 and FIG. 10, for the output signal terminal and the common voltage signal terminal corresponding to the same light-emitting unit group, a dummy signal terminal is arranged between the output signal terminal and the common voltage signal terminal.

In some embodiments, during specific implementation, an orthographic projection of the second signal line 230 in the first direction F1 overlaps orthographic projections of two signal terminals in the first direction F1. Exemplarily, as for the two signal terminals with orthographic projection overlapping the orthographic projection of the second signal line 230 in the first direction F1, the two signal terminals are both second signal terminals. That is, as shown in FIG. 1, FIG. 7 and FIG. 10, a second signal line 230 may be electrically connected with two second signal terminals. In this way, a second input signal is input to a second signal line 230 through two second signal terminals, to allow the second signal line 230 to provide the second input signal to two adjacent columns of light-emitting units 100.

In some embodiments, during specific implementation, as for the two signal terminals with orthographic projection overlapping the orthographic projection of the second signal line 230 in the first direction F1, one signal terminal in the two signal terminals may be the second signal terminal, and the other signal terminal may be the dummy signal terminal.

In some embodiments, during specific implementation, the light-emitting substrate may further include a flexible printed circuit (FPC). The flexible printed circuit may be electrically connected with the above first signal terminal, the output signal terminal, the second signal terminal, the driving signal terminal and the common voltage signal terminal through bonding. In addition, the flexible printed circuit is further configured to be bonded with other components, and the other components are, such as a light emitting control circuit. The light emitting control circuit may provide a plurality of first input signals and a plurality of second input signals, these first input signals and second input signals are transmitted to each first signal line 210 and second signal line 230 through the flexible printed circuit, and then are transmitted to each light-emitting unit group 100, so as to control the light-emitting substrate 10 to emit light. In addition, the light emitting control circuit may further provide a drive voltage and a common voltage, and the drive voltage and the common voltage may be transmitted to the drive signal line 240 and the common voltage signal line 250 respectively through the drive signal terminal and the common voltage signal terminal.

In some embodiments, the light-emitting elements may be electrically connected with the light-emitting substrate by adopting a massive transfer method, reflow soldering and other processes.

In some embodiments, the drive circuits may also be electrically connected with the light-emitting substrate by adopting the massive transfer method, the reflow soldering and other processes.

At least one embodiment of the disclosure further provides a display apparatus, and the display apparatus includes a display panel and the light-emitting substrate provided by any embodiment of the disclosure. The display apparatus may realize regional independent control of light-emitting brightness, with low power consumption, high integration and simple control mode. It can be used in conjunction with a liquid crystal display device to realize high-contrast display.

Figure 11:
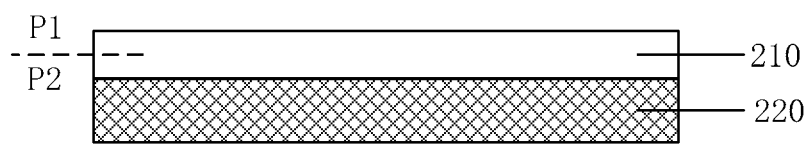
FIG. 11 is a schematic structural diagram of a display apparatus according to some embodiments of the disclosure.

In some embodiments, during specific implementation, as shown in FIG. 11, in some embodiments, the display apparatus 20 includes a display panel 210 and a light-emitting substrate 220. For example, the light-emitting substrate 220 may be the light-emitting substrate provided by any embodiment of the disclosure, such as the above light-emitting substrate 10.

For example, the display panel 210 has a display side P1 and a non-display side P2 opposite to the display side P1, and the light-emitting substrate 220 is arranged on the non-display side P2 of the display panel 210 to be taken as a backlight unit. For example, the light-emitting substrate 220 may be taken as an area source to provide backlight to the display panel 210. For example, the display panel 210 may be an LCD panel, an electronic paper display panel and the like, which is not limited in the embodiment of the disclosure.

For example, the display apparatus 20 may be an LCD apparatus, an electronic paper display apparatus and the like, or may be other apparatuses with a display function, which is not limited in the embodiment of the disclosure. For example, the display apparatus 20 may be a mobile phone, a tablet computer, a television, a display, a laptop, a digital photo frame, a navigator, an e-book and any product or component with a display function, which is not limited in the embodiment of the disclosure.

It should be noted that the light-emitting substrate 10 provided by the embodiment of the disclosure may be taken as the backlight unit to be applied to the above display apparatus 20, and may also be separately taken as a substrate with a display function or a light-emitting function for use, which is not limited in the embodiment of the disclosure.

As for detailed description and technical effects of the display apparatus 20, please refer to the description of the light-emitting substrate 10 in the previous text, which will not be repeated here. The display apparatus 20 may further include more components and structures, which may be determined according to the actual needs and is not limited in the embodiment of the disclosure.

At least one embodiment of the disclosure provides a light-emitting substrate and a display apparatus. The light-emitting substrate may realize regional independent control of light-emitting brightness, with low power consumption, high integration and simple control mode. It can be used in conjunction with a liquid crystal display device to realize high-contrast display. Moreover, the light-emitting substrate may reduce signal interference and improve a display effect.

Although the preferred embodiments of the disclosure have been described, those skilled in the art can make additional changes and modifications on these embodiments once they know the basic creative concept. So the appended claims are intended to include the preferred embodiments and all changes and modifications that fall into the scope of the disclosure.

Apparently, those skilled in the art may perform various changes and modifications on the embodiments of the disclosure without departing from the spirit and scope of the embodiments of the disclosure. Therefore, if these changes and modifications on the embodiments of the disclosure fall in the scope of the claims of the disclosure and their equivalent technologies, the disclosure is intended to include these changes and modifications.

What is claimed is:

1. A light-emitting substrate, comprising:
a base substrate, comprising a plurality of light-emitting units arranged in an array, wherein each light-emitting unit comprises a drive circuit and a light-emitting group coupled with the drive circuit, and the light-emitting group comprises a plurality of light-emitting elements; and
a first signal line, disposed on the base substrate and extending in a first direction, wherein
drive circuits in at least two different light-emitting units in the first direction are coupled with each other;
the drive circuit comprises a first input terminal, and the first signal line is coupled with a first input terminal of a drive circuit in at least two drive circuits that are coupled with each other;
wherein the plurality of light-emitting units are arranged in N rows and M columns and divided into a plurality of light-emitting unit groups, each light-emitting unit group comprises N rows and Y columns, with a total of N*Y light-emitting units, and one first signal line corresponds to one light-emitting unit;
in a same light-emitting unit group, the N*Y light-emitting units are sequentially numbered according to row and column distribution positions, a first input terminal of a drive circuit of a light-emitting unit with index of 1 is electrically connected with the first signal line corresponding to the light-emitting unit group, and an output terminal of the drive circuit of the light-emitting unit with index of P is electrically connected with a first input terminal of the drive circuit of the light-emitting unit with index of (P+1) through a first connecting line; and
the light-emitting substrate further comprises an output line, wherein the output line extends in the first direction, and an output terminal of the drive circuit of the light-emitting unit with index of (N*Y) is electrically connected with the output line;
wherein N is an integer greater than 0, M is an integer greater than 0, 0<Y≤M and Y is an integer, 0<P<N*Y and P is an integer.

2. The light-emitting substrate according to claim 1, wherein any two light-emitting units that are adjacent to each other along the first direction are coupled with each other through a first connecting line;
In each light-emitting unit group, one light-emitting unit furthest from the first signal line is coupled to another light-emitting unit that adjacent to the one light-emitting unit in the second direction through a first connecting line.

3. The light-emitting substrate according to claim 1, wherein in the same light-emitting unit group, the light-emitting unit with index of 1 is arranged adjacent to a light-emitting unit with index of N*Y in a second direction, and a light-emitting unit with index of N*Y/2 is arranged adjacent to a light-emitting unit with index of (N*Y/2+1) in the second direction;
wherein Y is an even number.

4. A display apparatus, comprising the light-emitting substrate according to claim 3 and a display panel; wherein the light-emitting substrate is an backlight unit; and the light-emitting substrate is arranged on a non-display side of the display panel, and is taken as an area source to provide backlight for the display panel.

5. The light-emitting substrate according to claim 3, wherein Y=2.

6. The light-emitting substrate according to claim 1, wherein at least one of the first connecting line or the output line is located on a side of the first signal line facing away from the base substrate; or at least one of the first connecting line or the output line is disposed in a same layer as the first signal line.

7. The light-emitting substrate according to claim 6, wherein each drive circuit further comprises a second input terminal; the light-emitting substrate further comprises a second signal line; and the second signal line is electrically connected with the second input terminal of the drive circuit.

8. The light-emitting substrate according to claim 7, wherein in the same light-emitting unit group, the light-emitting unit with index of 1 is arranged adjacent to a light-emitting unit with index of N*Y in a second direction, and a light-emitting unit with index of N*Y/2 is arranged adjacent to a light-emitting unit with index of (N*Y/2+1) in the second direction;

wherein Y=2.

9. The light-emitting substrate according to claim 8, wherein in the same light-emitting unit group, the first connecting lines for coupling the drive circuits surround the second signal line.

10. The light-emitting substrate according to claim 9, wherein the second signal line extends in the first direction.

11. The light-emitting substrate according to claim 9, wherein second input terminals of all drive circuits in one light-emitting unit group are all electrically connected with a same second signal line.

12. The light-emitting substrate according to claim 9, wherein the drive circuit further comprises a common voltage terminal; the light-emitting group is electrically connected between the drive voltage terminal and the output terminal of the drive circuit; and the light-emitting substrate further comprises:
a common voltage signal line electrically connected with the common voltage terminal; and
a drive signal line electrically connected with the drive voltage terminal;
wherein the common voltage signal line and the drive signal line both extend in the first direction;
wherein each drive circuit further comprises a second input terminal; the light-emitting substrate further comprises a second signal line; and the second signal line is electrically connected with the second input terminal of the drive circuit;
wherein the first connecting line, the output line, the first signal line, the second signal line, the common voltage signal line, and the drive signal line are disposed in the same layer;
a material of the base substrate is glass or quartz.

13. The light-emitting substrate according to claim 12, wherein the first input terminal is configured to receive a first input signal, wherein the first input signal is an address signal; and/or, the first input terminal of the drive circuit of the light-emitting unit with index of (P+1) is configured to receive a first input signal, wherein the first input signal is a relay signal output from the output terminal of the drive circuit of the light-emitting unit with index of P.

14. The light-emitting substrate according to claim 13, wherein the second input terminal is configured to receive a second input signal, wherein the second input signal provides electrical power to the drive circuit.

15. The light-emitting substrate according to claim 1, wherein the drive circuit further comprises a common voltage terminal; the light-emitting group is electrically connected between the drive voltage terminal and the output terminal of the drive circuit; and the light-emitting substrate further comprises:
a common voltage signal line electrically connected with the common voltage terminal; and
a drive signal line electrically connected with the drive voltage terminal;
wherein the common voltage signal line and the drive signal line both extend in the first direction.

16. The light-emitting substrate according to claim 15, wherein in the same light-emitting unit group, the light-emitting unit with index of 1 is arranged adjacent to a light-emitting unit with index of N*Y in a second direction, and a light-emitting unit with index of N*Y/2 is arranged adjacent to a light-emitting unit with index of (N*Y/2+1) in the second direction;

wherein Y=2.

17. The light-emitting substrate according to claim 16, wherein each light-emitting element comprises a positive electrode and a negative electrode, and positive electrodes and negative electrodes of the plurality of light-emitting elements are sequentially connected in positive-electrode-to-negative-electrode series; or each light-emitting element comprises a positive electrode and a negative electrode, and positive electrodes and negative electrodes of the plurality of light-emitting elements are sequentially connected in positive-electrode-to-negative-electrode series, and the light-emitting elements are micro light emitting diodes or mini light emitting diodes.

18. The light-emitting substrate according to claim 16, wherein one column of light-emitting units corresponds to one common voltage signal line and one drive signal line.

19. The light-emitting substrate according to claim 18, wherein for the common voltage signal line, the drive signal line and the second signal line corresponding to a column of light-emitting units, the common voltage signal line is located between the drive signal line and the second signal line.

20. The light-emitting substrate according to claim 19, wherein a light-emitting unit group comprises two columns of light-emitting units; and orthographic projections of two drive signal lines corresponding to a same light-emitting unit group on the base substrate are symmetric in respect to an orthographic projection of the second signal line on the base substrate; and/or orthographic projections of two common voltage signal lines corresponding to a same light-emitting unit group on the base substrate are symmetric in respect to an orthographic projection of the second signal line on the base substrate.

* * * * *